US012764881B2

(12) United States Patent
La et al.

(10) Patent No.: US 12,764,881 B2
(45) Date of Patent: Oct. 13, 2026

(54) DISPLAY DEVICE INCLUDING IMPACT RESISTANT LAYER

(71) Applicant: Samsung Display Co., LTD., Yongin-si (KR)

(72) Inventors: Sojeong La, Yongin-si (KR); Jaiku Shin, Yongin-si (KR); Sung Chul Choi, Yongin-si (KR); Munsik Ham, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 231 days.

(21) Appl. No.: 18/234,930

(22) Filed: Aug. 17, 2023

(65) Prior Publication Data

US 2024/0164035 A1 May 16, 2024

(30) Foreign Application Priority Data

Nov. 11, 2022 (KR) ........................ 10-2022-0150924

(51) Int. Cl.

*H05K 5/03* (2006.01)
*H05K 5/00* (2025.01)
*H10K 59/12* (2023.01)
*H10K 102/00* (2023.01)

(52) U.S. Cl.

CPC ............. *H05K 5/03* (2013.01); *H05K 5/0018* (2022.08); *H10K 59/12* (2023.02); *H10K 2102/311* (2023.02)

(58) Field of Classification Search

CPC ............................ G06F 1/1652; G06F 1/1641
See application file for complete search history.

(56) References Cited

U.S. PATENT DOCUMENTS

2021/0107251 A1* 4/2021 Chen ................... H04M 1/0269
2021/0141124 A1* 5/2021 Park ......................... G02B 1/14
2021/0201710 A1* 7/2021 Kim ...................... G06F 1/1626
2021/0259102 A1 8/2021 Shin et al.
2022/0139274 A1* 5/2022 Sim ......................... B32B 15/08
361/679.01

(Continued)

FOREIGN PATENT DOCUMENTS

CN 217718922 U * 11/2022 ............. G06F 1/203
CN 217719605 U * 11/2022 ........... H05K 5/0017

(Continued)

*Primary Examiner* — Abhishek M Rathod
(74) *Attorney, Agent, or Firm* — CANTOR COLBURN LLP

(57) ABSTRACT

A display device includes a display panel including a first non-folding region, a folding region, and a second non-folding region, a first support plate disposed below the display panel and having a plurality of openings which overlap the folding region and are defined in the first support plate, a second-first support plate overlapping the first non-folding region and disposed below the first support plate in a plan view, a second-second support plate overlapping the second non-folding region and disposed below the first support plate in the plan view, and a plurality of impact resistant layers disposed between the first support plate and the second-first support plate and between the first support plate and the second-second support plate. Each of the impact resistant layers may have a thickness of about 40 micrometers to about 300 micrometers.

7 Claims, 19 Drawing Sheets

(56) References Cited

U.S. PATENT DOCUMENTS

| | | | | |
|---|---|---|---|---|
| 2022/0167509 | A1 | 5/2022 | Wu et al. | |
| 2022/0199923 | A1 | 6/2022 | Yamane et al. | |
| 2022/0374058 | A1* | 11/2022 | Kim | G06F 1/203 |
| 2022/0377922 | A1* | 11/2022 | Yoon | H10K 71/70 |
| 2022/0397934 | A1 | 12/2022 | La et al. | |

FOREIGN PATENT DOCUMENTS

| | | | |
|---|---|---|---|
| KR | 20210104516 | A | 8/2021 |
| KR | 102305912 | B1 | 9/2021 |
| KR | 20220167844 | A | 12/2022 |

* cited by examiner

DISPLAY DEVICE INCLUDING IMPACT RESISTANT LAYER

This application claims priority to Korean Patent Application No. 10-2022-0150924, filed on Nov. 11, 2022, and all the benefits accruing therefrom under 35 U.S.C. § 119, the content of which in its entirety is herein incorporated by reference.

BACKGROUND

1. Field

The disclosure herein relates to a display device.

2. Description of the Related Art

An electronic device, such as a smart phone, a digital camera, a notebook computer, a navigation system, and a smart television, which provides an image to a user, include a display device for displaying an image. The display device generates an image and provides the image to a user through a display screen.

With a recent development of display device technology, various types of display devices are being developed. For example, various display devices that may be transformed into curved, folded, or rolled shapes are being developed. The display devices may be easy to carry and improve convenience of users.

A display device may include a display panel. The display device may include a plurality of support plates and adhesive layers disposed between the support plates in order to facilitate the folding of the display panel.

SUMMARY

The disclosure provides a display device capable of reducing the strain of a display panel when an external impact is applied thereto.

An embodiment of the inventive concept provides a display device including: a display panel including a first non-folding region, a folding region, and a second non-folding region; a first support plate disposed below the display panel and having a plurality of openings which overlap the folding region and are defined in the first support plate; a second-first support plate overlapping the first non-folding region and disposed below the first support plate in a plan view; a second-second support plate overlapping the second non-folding region and disposed below the first support plate in the plan view; and a plurality of impact resistant layers disposed between the first support plate and the second-first support plate and between the first support plate and the second-second support plate. Each of the plurality of impact resistant layers has a thickness of about 40 micrometers to about 300 micrometers.

In an embodiment of the inventive concept, a display device includes: a display panel including a first non-folding region, a folding region, and a second non-folding region; a first support plate disposed below the display panel and having a plurality of openings which overlap the folding region and are defined in the first support plate; a second-first support plate overlapping the first non-folding region and disposed below the first support plate in a plan view; a second-second support plate overlapping the second non-folding region and disposed below the first support plate in the plan view; a cover layer overlapping the first non-folding region, the folding region, and the second non-folding region and disposed below the first support plate to cover the openings in the plan view; and a plurality of impact resistant layers disposed between the cover layer and the second-first support plate and between the cover layer and the second-second support plate. Each of the plurality of impact resistant layers may have a thickness of about 40 micrometers to about 300 micrometers.

In an embodiment of the inventive concept, a display device includes: a display panel including a first non-folding region, a folding region, and a second non-folding region; a first support plate disposed below the display panel and having a plurality of openings which overlap the folding region and are defined in the first support plate; a second-first support plate overlapping the first non-folding region and disposed below the first support plate in a plan view; a second-second support plate overlapping the second non-folding region and disposed below the first support plate in the plan view; a first digitizer disposed between the first support plate and the second-first layer; a second digitizer disposed between the first support plate and the second-second adhesive layer; a connection part which connects the first and second digitizers; and a plurality of impact resistant layers disposed between the first digitizer and the second-first support plate and between the second digitizer and the second-second support plate. Each of the plurality of impact resistant layers may have a thickness of about 40 micrometers to about 300 micrometers.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
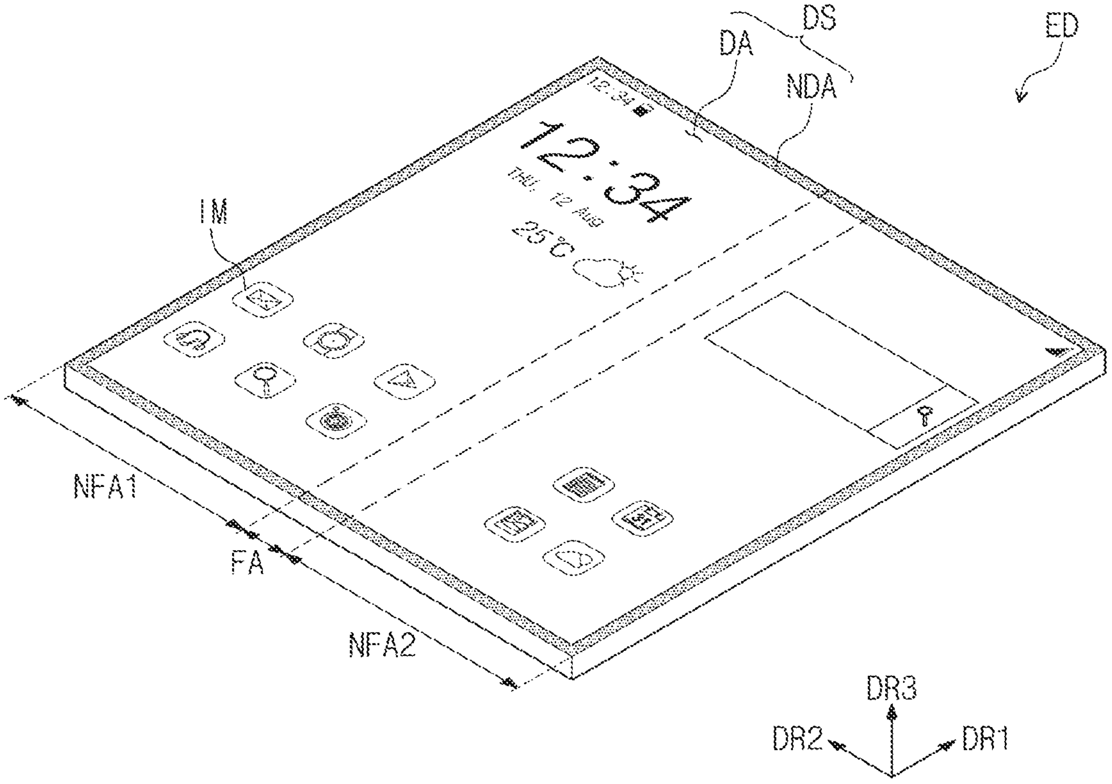
FIG. 1 is a perspective view of an embodiment of an electronic device according to the inventive concept.

The advantages and features of the inventive concept and the methods of achieving them will be made apparent with reference to the embodiments described below in detail in conjunction with the accompanying drawings. However, the inventive concept is not limited to the embodiments disclosed below and may be implemented in various different forms, and the embodiments are merely provided to make the disclosure complete and to fully disclose the scope of the inventive concept to those skilled in the art to which the disclosure pertains, and the disclosure is defined only by the scope of the appended claims. Like reference numerals refer to like elements throughout the specification.

It will be understood that when an element or layer is referred to as being "on" another element or layer, it can be directly on the other element or layer or intervening elements or layers may be present. In contrast, when an element is referred to as being "directly on," another element or layer, there are no intervening elements or layers present. The term "and/or" includes any and all combinations of one or more of the stated items.

Spatially relative terms, such as "below", "beneath", "lower", "above", and "upper", can be used to easily describe a correlation between one element or component and another element or component as illustrated in the drawing figures. The spatially relative terms should be understood as encompassing different orientations of elements in use or operation in addition to the orientations illustrated in the drawing figures. Like reference numbers refer to like elements throughout the specification.

It will be understood that, although the terms first, second, etc. may be used herein to describe various elements, components, and/or sections, these elements, components, and/or sections should not be limited by these terms. These terms are only used to distinguish one element, component, or section from another element, component, or section. Accordingly, it goes without saying that a first element, a first component or a first section referred to below may be a second element, a second component or a second section within the technical spirit of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

The term such as "module" as used herein may be intended to mean a software component or a hardware component that performs a predetermined function. The hardware component may include a field-programmable gate array ("FPGA") or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

Embodiments described herein will be described with reference to plan views and cross-sectional views, which are the ideal schematic diagrams of the invention. Accordingly, the shapes of the illustrative drawings may be modified due to manufacturing techniques and/or tolerances. Therefore, the embodiments of the inventive concept are not limited to the specific shapes illustrated, but also include changes in shapes generated according to manufacturing processes. Therefore, the regions illustrated in the drawings have schematic properties, and the shapes of the regions illustrated in the drawings are for illustrating the specific shapes of the regions of elements and are not intended to limit the scope of the inventive concept.

Hereinafter, preferred embodiments of the inventive concept will be described in detail with reference to the accompanying drawings.

Figure 2A:
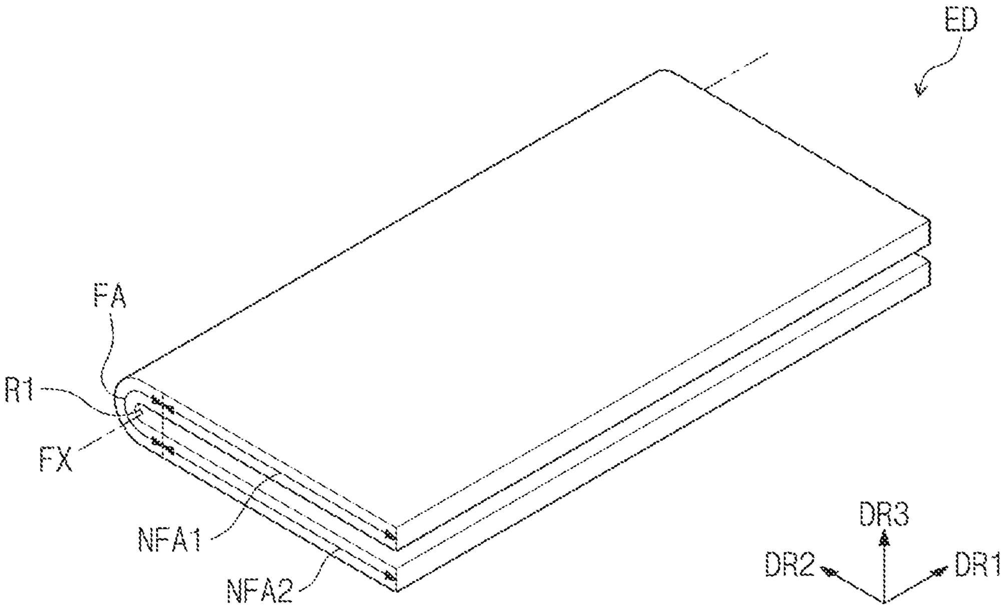
FIGS. 2A and 2B illustrate a folded state of the electronic device illustrated in FIG. 1.
Figure 2B:
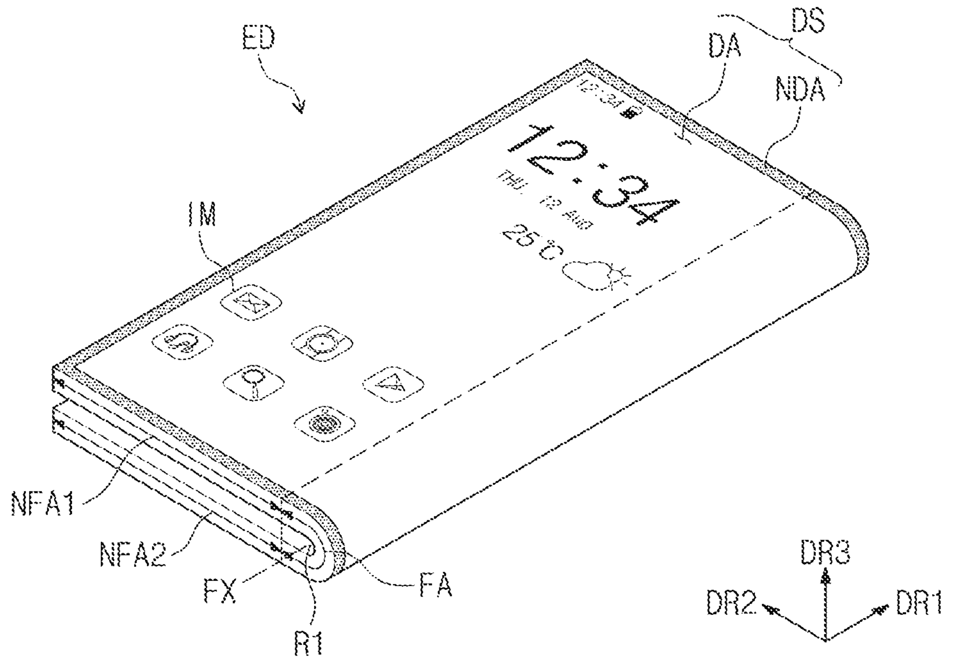

FIG. 1 is a perspective view of an embodiment of an electronic device according to the inventive concept. FIGS. 2A and 2B illustrate a folded state of the electronic device illustrated in FIG. 1.

Referring to FIG. 1, the electronic device ED in an embodiment of the inventive concept may have a quadrangular shape, e.g., rectangular shape including long sides extending in a first direction DR1 and short sides extending in a second direction DR2 crossing the first direction DR1. Without being limited thereto, however, the electronic device ED may have various shapes such as a circular shape and a polygonal shape. The electronic device ED may be flexible.

Hereinafter, a direction substantially perpendicular to a plane defined by the first and second directions DR1 and DR2 is defined as a third direction DR3. In addition, in this specification, the expression "in a plan view" may be defined as a state viewed from the third direction DR3.

The electronic device ED may include a folding region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2. The folding region FA, the first non-folding region NFA1, and the second non-folding region NFA2 may be arranged in the second direction DR2.

Although one folding region FA and two non-folding regions NFA1 and NFA2 are illustrated in an embodiment, the number of the folding region FA and non-folding regions NFA1 and NFA2 is not limited thereto. In an embodiment, the electronic device ED may include a plurality of non-folding regions, the number of which is greater than two, and a plurality of folding regions disposed between the non-folding regions, for example.

The upper surface of the electronic device ED may be defined as a display surface DS, and the display surface DS may have a plane defined by the first and second directions DR1 and DR2. Images IM generated by the electronic device ED may be provided to a user through the display surface DS.

The display surface DS may include a display region DA and a non-display region NDA around the display region DA. The display region DA may display an image, and the non-display region NDA may not display an image. The non-display region NDA may surround the display region DA and define an edge of the electronic device ED, which is printed in a predetermined color.

Referring to FIGS. 2A and 2B, the electronic device ED may be a foldable electronic device ED that is folded or unfolded. In an embodiment, the electronic device ED may be folded as the folding region FA may be bent with respect to a folding axis FX parallel to the first direction DR1, for example. The folding axis FX may be defined as a long axis parallel to the long side of the electronic device ED. When the electronic device ED is folded, the first non-folding region NFA1 and the second non-folding region NFA2 face each other, and the electronic device ED may be in-folded so that the display surface DS is not exposed to the outside. However, the inventive concept is not limited thereto. In an embodiment, as illustrated in FIG. 2B, the electronic device ED may be out-folded with respect to the folding axis FX so that the display surface DS is exposed to the outside, for example. In addition, although not illustrated, the electronic device ED may be in-folded and out-folded at the same time. In an embodiment, the folding region FA may be folded with a predetermined curvature and may have a radius of curvature R1.

Figure 3:
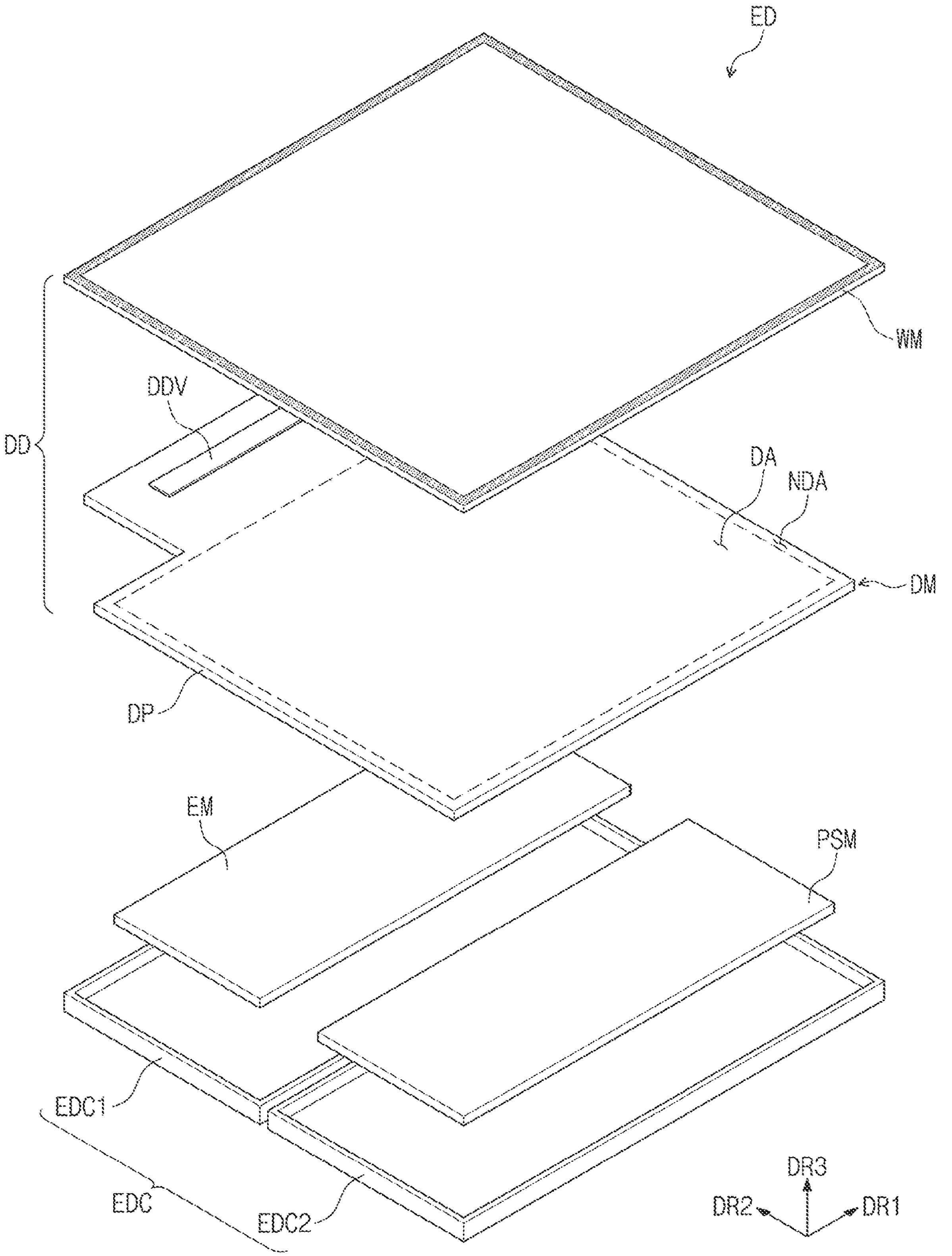
FIG. 3 is an exploded perspective view of the electronic device illustrated in FIG. 1.

FIG. 3 is an exploded perspective view of the electronic device illustrated in FIG. 1.

Referring to FIG. 3, the electronic device ED may include a display device DD, an electronic module EM, a power supply module PSM, and a case EDC. Although not illustrated, the electronic device ED may further include a mechanical structure (e.g., a hinge) for controlling the folding operation of the display device DD.

The display device DD may generate an image and sense an external input. The display device DD may include a window module WM and a display module DM. The window module WM may provide a front surface of the electronic device ED. The window module WM may be disposed on and protect the display module DM. The window module WM may transmit light generated by the display module DM and provide the light to a user.

The display module DM may include at least a display panel DP. Although only the display panel DP is illustrated among the stacked structure of the display module DM in FIG. 3, the display module DM may further include a plurality of components disposed above and below the display panel DP. A detailed stacked structure of the display module DM will be described in detail below. The display panel DP may include a display region DA and a non-display region NDA which correspond to the display region DA and the non-display region NDA of the electronic device ED of FIG. 1.

The display module DM may include a data driver DDV disposed on the non-display region NDA of the display panel DP. The data driver DDV may be manufactured in the form of an integrated circuit chip and disposed (e.g., mounted) on the non-display region NDA. Without being limited thereto, however, the data driver DDV may be disposed (e.g., mounted) on a flexible circuit board connected to the display panel DP.

The electronic module EM and the power supply module PSM may be disposed below the display device DD. Although not illustrated, the electronic module EM and the power supply module PSM may be connected to each other through a separate flexible circuit board. The electronic module EM may control the operation of the display device DD. The power supply module PSM may supply power to the electronic module EM.

The case EDC may accommodate the display device DD, the electronic module EM, and the power supply module PSM. The case EDC may include two first and second cases EDC1 and EDC2 in order to fold the display device DD. The first and second cases EDC1 and EDC2 may extend in the first direction DR1 and may be arranged in the second direction DR2.

Although not illustrated, the electronic device ED may further include a hinge structure which connects the first and second cases EDC1 and EDC2. The case EDC may be coupled to the window module WM. The case EDC may protect the display device DD, the electronic module EM, and the power supply module PSM.

Figure 4:
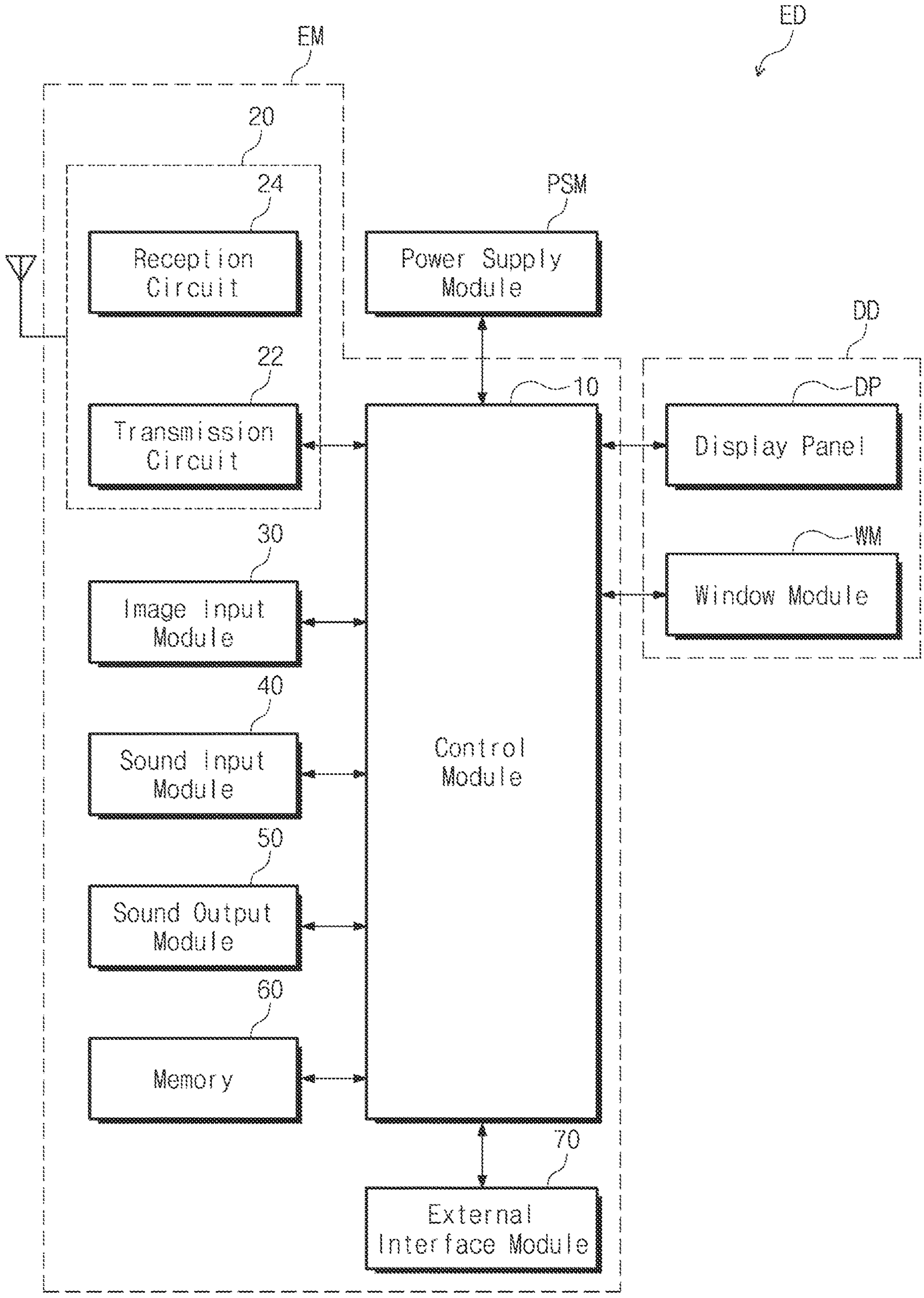
FIG. 4 is a block diagram of the electronic device illustrated in FIG. 3.

FIG. 4 is a block diagram of the electronic device illustrated in FIG. 3.

Referring to FIG. 4, the electronic device ED may include an electronic module EM, a power supply module PSM, and a display device DD. The electronic module EM may include a control module 10, a wireless communication module 20, an image input module 30, a sound input module 40, a sound output module 50, a memory 60, an external interface module 70 or the like. The modules may be disposed (e.g., mounted) on a circuit board or electrically connected to each other through a flexible circuit board. The electronic module EM may be electrically connected to the power supply module PSM.

The control module 10 may control the overall operation of the electronic device ED. In an embodiment, the control module 10 may activate or deactivate the display device DD according to a user input, for example. The control module 10 may control the image input module 30, the sound input module 40, the sound output module 50, or the like according to a user input. The control module 10 may include at least one microprocessor.

The wireless communication module 20 may transmit/receive wireless signals to/from other terminals, using a Bluetooth or Wi-Fi line. The wireless communication module 20 may transmit/receive voice signals, using a general communication line. The wireless communication module 20 may include a transmission circuit 22, which modulates and transmits a signal to be transmitted, and a reception circuit 24 which demodulates the received signal.

The image input module 30 may process an image signal and convert the image signal into image data that may be displayed on the display device DD. The sound input module 40 may receive an external sound signal through a microphone in a recording mode or a voice recognition mode and convert the external sound signal into electrical voice data. The sound output module 50 may convert sound data received from the wireless communication module 20 or sound data stored in the memory 60 and output the converted sound data to the outside.

The external interface module 70 may serve as an interface connected to an external charger, a wired/wireless data port, a card socket (e.g., a memory card or a subscriber identity module/user identity module ("SIM/UIM") card), or the like.

The power supply module PSM may supply power desired for the overall operation of the electronic device ED. The power supply module PSM may include a conventional battery device.

Figure 5:
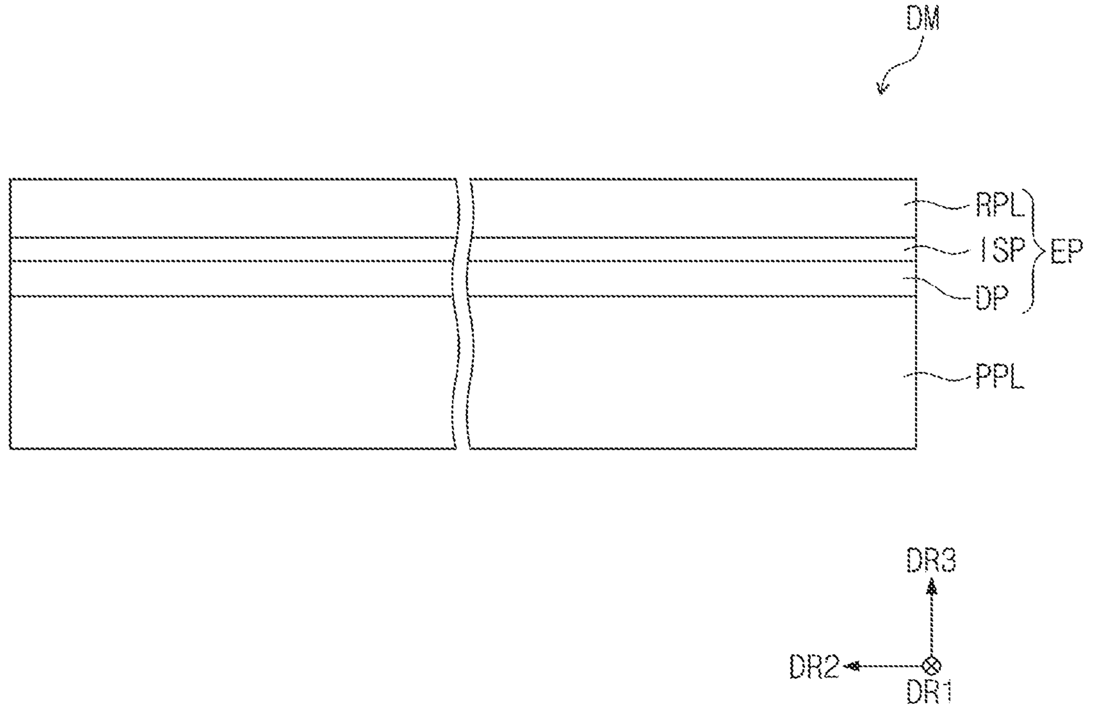
FIG. 5 is a schematic cross-sectional view of a display module illustrated in FIG. 4.

FIG. 5 is a schematic cross-sectional view of the display module illustrated in FIG. 4.

Referring to FIG. 5, the display module DM may include a display panel DP, an input sensing unit ISP disposed on the display panel DP, a reflection prevention layer RPL disposed on the input sensing unit ISP, and a panel protection layer PPL disposed below the display panel DP. The display panel DP may be a flexible display panel. In an embodiment, the display panel DP may include a flexible substrate and a plurality of elements disposed on the flexible substrate, for example.

The display panel DP in an embodiment of the inventive concept may be a light-emitting display panel and is not particularly limited thereto. In an embodiment, the display panel DP may be an organic light-emitting display panel or an inorganic light-emitting display panel, for example. A light-emitting layer of the organic light-emitting display panel may include or consist of an organic light-emitting material. A light-emitting layer of the inorganic light-emitting display panel may include or consist of quantum dots, quantum rods, or the like. Hereinafter, the display panel DP will be described as an organic light-emitting display panel.

The input sensing unit ISP may include a plurality of sensors (not illustrated) which sense an external input in a capacitive manner. The input sensing unit ISP may be formed directly on the display panel DP when the display module DM is manufactured.

The reflection prevention layer RPL may be disposed on the input sensing unit ISP. When the display module DM is manufactured, the reflection prevention layer RPL may be formed directly on the input sensing unit ISP. The reflection prevention layer RPL may be defined as an external light reflection prevention film. The reflection prevention layer RPL may reduce the reflectance of external light incident from above the display device DD toward the display panel DP.

In an embodiment, the input sensing unit ISP may be formed directly on the display panel DP, and the reflection prevention layer RPL may be formed directly on the input sensing unit ISP, but the inventive concept is not limited thereto. In an embodiment, the input sensing unit ISP may be separately manufactured and attached to the display panel DP by an adhesive layer, and the reflection prevention layer RPL may be separately manufactured and attached to the input sensing unit ISP by an adhesive layer, for example.

The display panel DP, the input sensing unit ISP, and the reflection prevention layer RPL may be defined as an electronic panel EP.

The panel protection layer PPL may be disposed below the display panel DP. The panel protection layer PPL may protect a lower portion of the display panel DP. The panel protection layer PPL may include or consist of a flexible plastic material. In an embodiment, the panel protection layer PPL may include or consist of polyethylene terephthalate ("PET"), for example.

Figure 6:
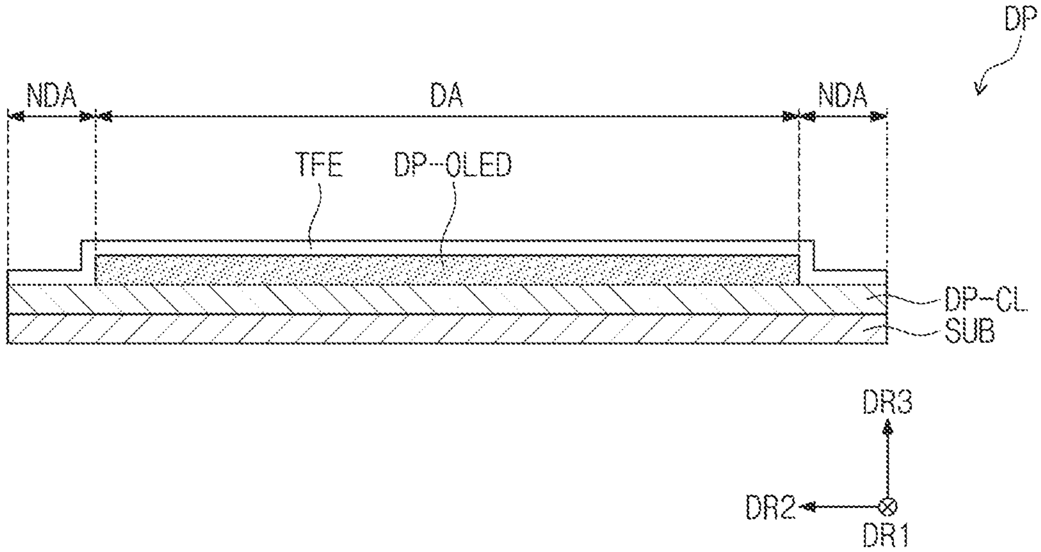
FIG. 6 illustrates a cross section of a display panel illustrated in FIG. 5.

FIG. 6 illustrates a cross section of the display panel illustrated in FIG. 5.

FIG. 6 illustrates a cross section of the display panel DP viewed in the first direction DR1.

Referring to FIG. 6, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include or consist of a flexible plastic material such as glass or polyimide ("PI"). The display element layer DP-OLED may be disposed on the display region DA.

A plurality of pixels may be disposed in the circuit element layer DP-CL and the display element layer DP-OLED. Each of the pixels may include a transistor disposed on the circuit element layer DP-CL and a light-emitting element disposed on the display element layer DP-OLED and connected to the transistor. The configuration of the pixel will be described in detail in FIG. 7.

The thin film encapsulation layer TFE may be disposed on the circuit element layer DP-CL so as to cover the display element layer DP-OLED. The thin film encapsulation layer TFE may protect the pixels from moisture, oxygen, and external foreign substances.

Figure 7:
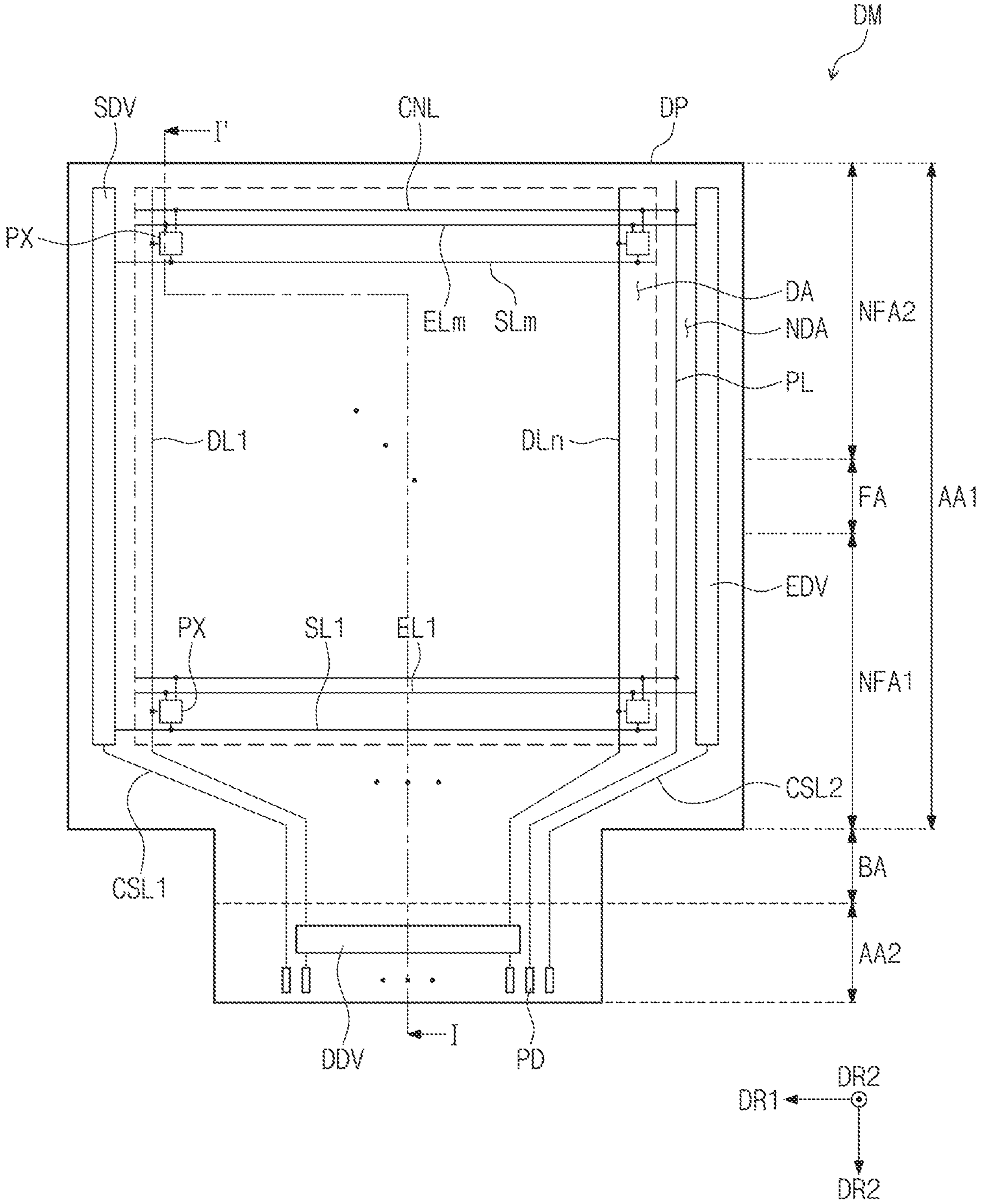
FIG. 7 is a plan view of the display panel illustrated in FIG. 3.

FIG. 7 is a plan view of the display panel illustrated in FIG. 3.

Referring to FIG. 7, the display module DM may include a display panel DP, a scan driver SDV, a data driver DDV, and a light-emitting driver EDV.

The display panel DP may include a first region AA1, a second region AA2, and a bending region BA between the first region AA1 and the second region AA2. The bending region BA may extend in the first direction DR1, and the first region AA1, the bending region BA, and the second region AA2 may be arranged in the second direction DR2.

The first region AA1 may include a display region DA and a non-display region NDA around the display region DA. The non-display region NDA may surround the display region DA. The display region DA may display an image, and the non-display region NDA may not display an image. The second region AA2 and the bending region BA may not display an image.

When viewed in the first direction DR1, the first region AA1 may include a first non-folding region NFA1, a second non-folding region NFA2, and a folding region between the first non-folding region NFA1 and the second non-folding region NFA2.

The display panel DP may include a plurality of pixels PX, a plurality of scan lines SL1 to SLm, a plurality of data lines DL1 to DLn, a plurality of light-emitting lines EL1 to ELm, first and second control lines CSL1 and CSL2, a power line PL, a plurality of connection lines CNL, and a plurality of pads PD. Here, m and n are natural numbers. The pixels PX may be disposed in the display region DA and connected to the scan lines SL1 to SLm, the data lines DL1 to DLn, and the light-emitting lines EL1 to ELm.

The scan driver SDV and the light-emitting driver EDV may be disposed in the non-display region NDA. The scan driver SDV and the light-emitting driver EDV may be disposed in the non-display region NDA adjacent to opposite sides of the first region AA1 opposite to each other in the first direction DR1. The data driver DDV may be disposed in the second region AA2. The data driver DDV may be manufactured in the form of an integrated circuit chip and disposed (e.g., mounted) on the second region AA2.

The scan lines SL1 to SLm may extend in the first direction DR1 and be connected to the scan driver SDV. The data lines DL1 to DLn may extend in the second direction DR2 and be connected to the data driver DDV via the bending region BA. The light-emitting lines EL1 to ELm may extend in the first direction DR1 and be connected to the light-emitting driver EDV.

The power line PL may extend in the second direction DR2 and be disposed in the non-display region NDA. The power line PL may be disposed between the display region DA and the light-emitting driver EDV, but is not limited thereto, and the power line PL may be disposed between the display region DA and the scan driver SDV.

The power line PL may extend to the second region AA2 via the bending region BA. The power line PL may extend toward the lower end of the second region AA2 in a plan view. The power line PL may receive a driving voltage.

The connection lines CNL may extend in the first direction DR1 and be arranged in the second direction DR2. The connection lines CNL may be connected to the power line PL and the pixels PX. The driving voltage may be applied to the pixels PX through the power line PL and the connection lines CNL which are connected to each other.

The first control line CSL1 may be connected to the scan driver SDV and extend toward the lower end of the second region AA2 via the bending region BA. The second control line CSL2 may be connected to the light-emitting driver EDV and extend toward the lower end of the second region AA2 via the bending region BA. The data driver DDV may be disposed between the first control line CSL1 and the second control line CSL2.

In a plan view, the pads PD may be disposed adjacent to the lower end of the second region AA2. The data driver DDV, the power line PL, the first control line CSL1, and the second control line CSL2 may be connected to the pads PD.

The data lines DL1 to DLn may be connected to corresponding pads PD through the data driver DDV. In an embodiment, the data lines DL1 to DLn may be connected to the data driver DDV, and the data driver DDV may be connected to the pads PD respectively corresponding to the data lines DL1 to DLn, for example.

Although not illustrated, a printed circuit board may be connected to the pads PD, and a timing controller and a voltage generator may be disposed on the printed circuit board. The timing controller may be manufactured as an integrated circuit chip and disposed (e.g., mounted) on the printed circuit board. The timing controller and the voltage generator may be connected to the pads PD through the printed circuit board.

The timing controller may control the operation of the scan driver SDV, the data driver DDV, and the light-emitting driver EDV. The timing controller may generate a scan control signal, a data control signal, and a light-emitting control signal in response to control signals received from the outside. The voltage generator may generate a driving voltage.

The scan control signal may be provided to the scan driver SDV through the first control line CSL1. The light-emitting control signal may be provided to the light-emitting driver EDV through the second control line CSL2. The data control signal may be provided to the data driver DDV. The timing controller may receive image signals from the outside, convert the data format of the image signals so as to meet the interface specification of the data driver DDV, and provide the converted image signals to the data driver DDV.

The scan driver SDV may generate a plurality of scan signals in response to a scan control signal. The scan signals may be applied to the pixels PX through the scan lines SL1 to SLm. The scan signals may be sequentially applied to the pixels PX.

The data driver DDV may generate a plurality of data voltages corresponding to image signals in response to a data control signal. The data voltages may be applied to the pixels PX through the data lines DL1 to DLn. The light-emitting driver EDV may generate a plurality of light-emitting signals in response to a light-emitting control signal. The light-emitting signals may be applied to the pixels PX through the light-emitting lines EL1 to ELm.

The pixels PX may receive data voltages in response to scan signals. The pixels PX may display an image by emitting light having a luminance corresponding to the data voltages in response to light-emitting signals. The light-emitting time of the pixels PX may be controlled by the light-emitting signals.

Figure 8:
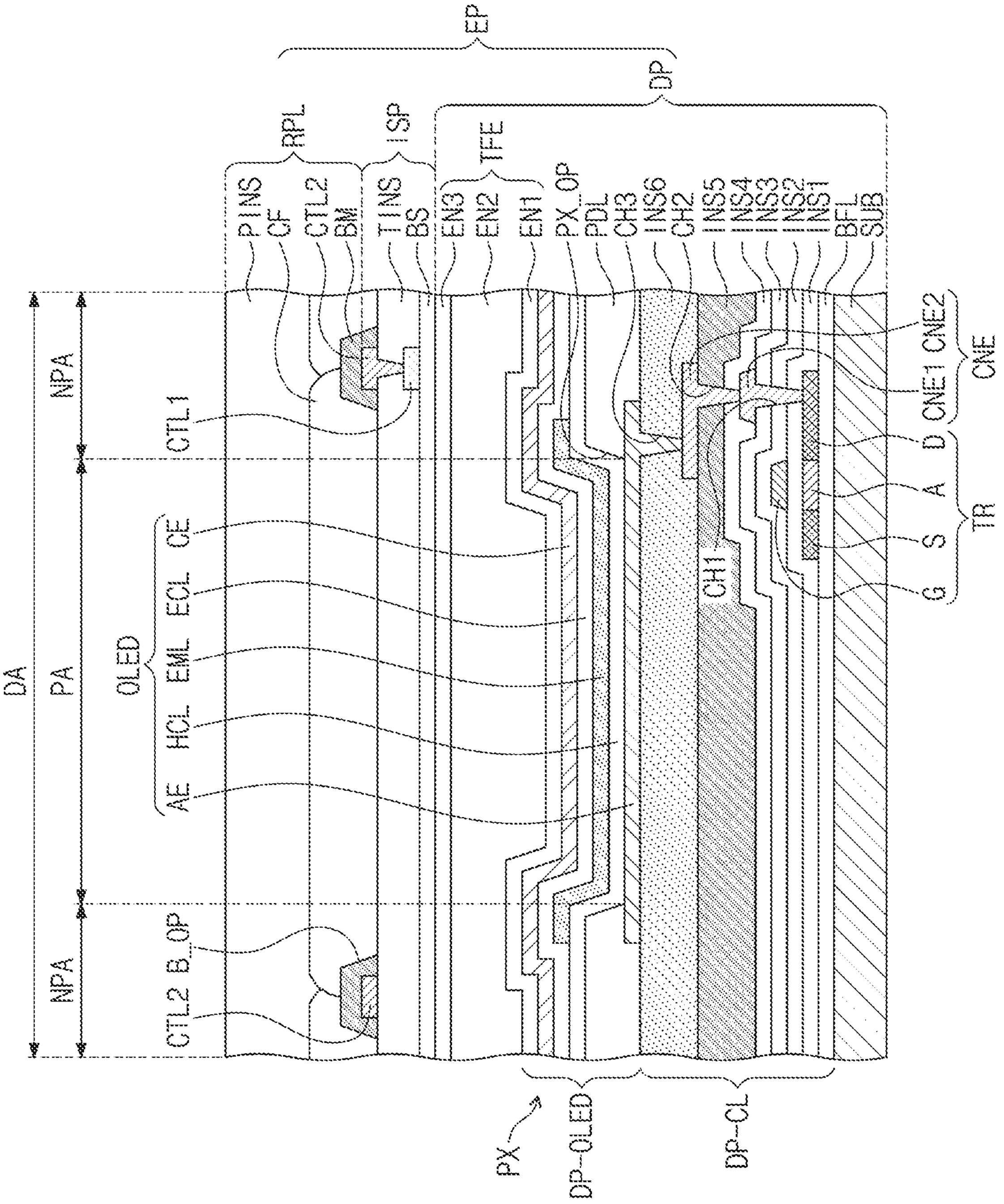
FIG. 8 illustrates a cross section of an electronic panel corresponding to any one pixel illustrated in FIG. 7.

FIG. 8 illustrates a cross section of an electronic panel corresponding to any one pixel illustrated in FIG. 7.

Referring to FIG. 8, the pixel PX may include a transistor TR and a light-emitting element OLED. The light-emitting element OLED may include a first electrode AE (or anode), a second electrode CE (or cathode), a hole control layer HCL, an electron control layer ECL, and a light-emitting layer EML.

The transistor TR and the light-emitting element OLED may be disposed on the substrate SUB. Although one transistor TR is illustrated in an embodiment, substantially, the pixel PX may include a plurality of transistors and at least one capacitor for driving the light-emitting element OLED.

The display region DA may include a light-emitting region PA corresponding to each of the pixels PX and a non-light-emitting region NPA around the light-emitting region PA. The light-emitting element OLED may be disposed in the light-emitting region PA.

A buffer layer BFL may be disposed on the substrate SUB, and the buffer layer BFL may be an inorganic layer. A semiconductor pattern may be disposed on the buffer layer BFL. The semiconductor pattern may include or consist of polysilicon, amorphous silicon, or metal oxide.

The semiconductor pattern may be doped with an N-type dopant or a P-type dopant. The semiconductor pattern may include a highly doped region and a lightly doped region. The conductivity of the highly doped region is greater than that of the lightly doped region, and the highly doped region may substantially serve as a source electrode and a drain electrode of the transistor TR. The lightly doped region may substantially correspond to an active (or channel) of the transistor.

The source S, the active A, and the drain D of the transistor TR may be formed from a semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR and the light-emitting element OLED to each other. The first connection electrode CNE1 may be disposed on the third insulating layer INS3 and connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fourth and fifth insulating layers INS4 and INS5.

A sixth insulating layer INS6 may be disposed on the second connection electrode CNE2. The layers from the buffer layer BFL to the sixth insulating layer INS6 may be defined as a circuit element layer DP-CL. The first insulating layer INS1 to the sixth insulating layer INS6 may be inorganic layers or organic layers.

The first electrode AE may be disposed on the sixth insulating layer INS6. The first electrode AE may be connected to the second connection electrode CNE2 through a third contact hole CH3 defined in the sixth insulating layer INS6. A pixel defining film PDL in which an opening PX_OP exposing a predetermined portion of the first electrode AE is defined may be disposed on the first electrode AE and the sixth insulating layer INS6.

The hole control layer HCL may be disposed on the first electrode AE and the pixel defining film PDL. The hole control layer HCL may include a hole transport layer and a hole injection layer.

The light-emitting layer EML may be disposed on the hole control layer HCL. The light-emitting layer EML may be disposed in a region corresponding to the opening PX_OP. The light-emitting layer EML may include or consist of an organic material and/or an inorganic material. The light-emitting layer EML may generate any one of red light, green light, and blue light.

The electron control layer ECL may be disposed on the light-emitting layer EML and the hole control layer HCL. The electron control layer ECL may include an electron transport layer and an electron injection layer. The hole control layer HCL and the electron control layer ECL may be commonly disposed in the light-emitting region PA and the non-light-emitting region NPA.

The second electrode CE may be disposed on the electron control layer ECL. The second electrode CE may be commonly disposed in the pixels PX. A layer in which the light-emitting element OLED is disposed may be defined as a display element layer DP-OLED.

The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include an inorganic insulating layer and protect the pixel PX from moisture/oxygen. The second encapsulation layer EN2 may include an organic insulating layer and protect the pixel PX from foreign substances such as dust particles.

A first voltage may be applied to the first electrode AE through the transistor TR, and a second voltage having a lower level than the first voltage may be applied to the second electrode CE. Holes and electrons injected into the light-emitting layer EML may be combined with each other to form excitons, and the light-emitting element OLED may emit light while the excitons transition to a ground state.

An input sensing unit ISP may be disposed on the thin film encapsulation layer TFE. The input sensing unit ISP may be manufactured directly on the upper surface of the thin film encapsulation layer TFE.

A base layer BS may be disposed on the thin film encapsulation layer TFE. The base layer BS may include an inorganic insulating layer. As a base layer BS, at least one inorganic insulating layer may be provided on the thin film encapsulation layer TFE.

The input sensing unit ISP may include a first conductive pattern CTL1 and a second conductive pattern CTL2 which are disposed on the first conductive pattern CTL1. The first conductive pattern CTL1 may be disposed on the base layer BS. An insulating layer TINS may be disposed on the base layer BS to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-light-emitting region NPA. Although not illustrated, the first and second conductive patterns CTL1 and CTL2 may be disposed on the non-light-emitting region NPA between the light-emitting regions PA and have a mesh shape.

The first and second conductive patterns CTL1 and CTL2 may form sensors of the aforementioned input sensing unit ISP. In an embodiment, the mesh-shaped first and second conductive patterns CTL1 and CTL2 may be separated from each other in a predetermined region to form the sensors, for example. A portion of the second conductive pattern CTL2 may be connected to the first conductive pattern CTL1.

A reflection prevention layer RPL may be disposed on the second conductive pattern CTL2. The reflection prevention layer RPL may include a black matrix BM and a plurality of color filters CF. The black matrix BM may overlap the non-light-emitting region NPA, and the color filters CF may respectively overlap the light-emitting regions PA.

The black matrix BM may be disposed on the insulating layer TINS so as to cover the second conductive pattern CTL2. An opening B_OP overlapping the light-emitting region PA and the opening PX_OP may be defined in the black matrix BM. The black matrix BM may absorb and block light. The width of the opening B_OP may be greater than that of the opening PX_OP.

The color filters CF may be disposed on the insulating layer TINS and the black matrix BM. The color filters CF may be respectively disposed in the openings B_OP. A planarization insulating layer PINS may be disposed on the color filters CF. The planarization insulating layer PINS may provide a flat upper surface.

When external light traveling toward the display panel DP is reflected by the display panel DP like a mirror and provided back to an external user, the external light may be viewed by the user. To prevent this phenomenon, in an embodiment, the reflection prevention layer RPL may include a plurality of color filters CF that display the same color as the pixels PX of the display panel DP. The color filters CF may filter external light into the same colors as the pixels PX. In this case, the external light may not be viewed by the user.

However, the inventive concept is not limited thereto, and the reflection prevention layer RPL may include a polarizing film to reduce the reflectance of external light. The polarizing film may be separately manufactured and attached to the input sensing unit ISP by an adhesive layer. The polarizing film may include a retarder and/or a polarizer.

Figure 9:
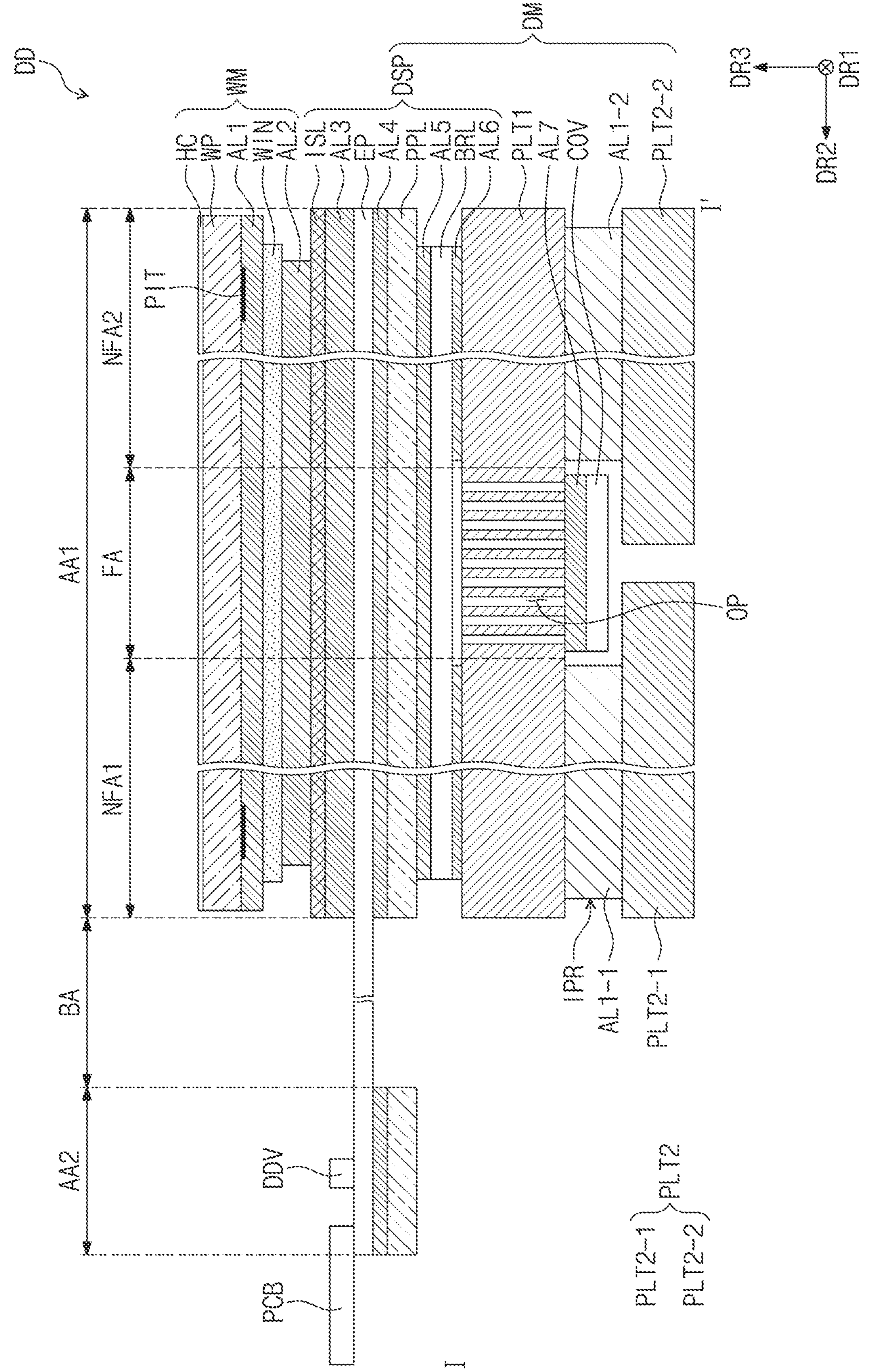
FIG. 9 is a cross-sectional view taken along line I-I" illustrated in FIG. 7.
Figure 10:
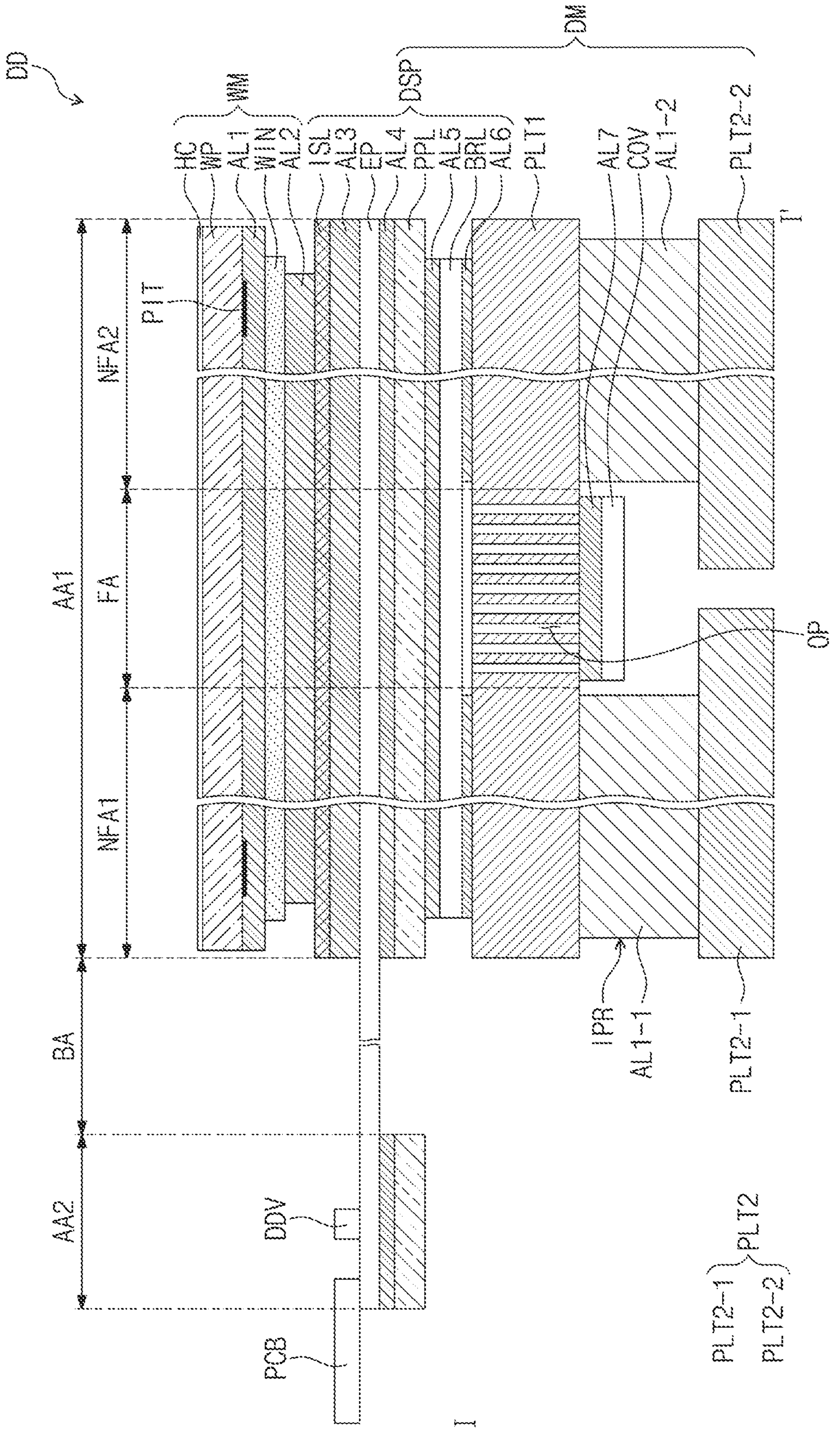
FIG. 10 is a cross-sectional view of another embodiment taken along line I-I' illustrated in FIG. 7 according to the inventive concept.
Figure 11:
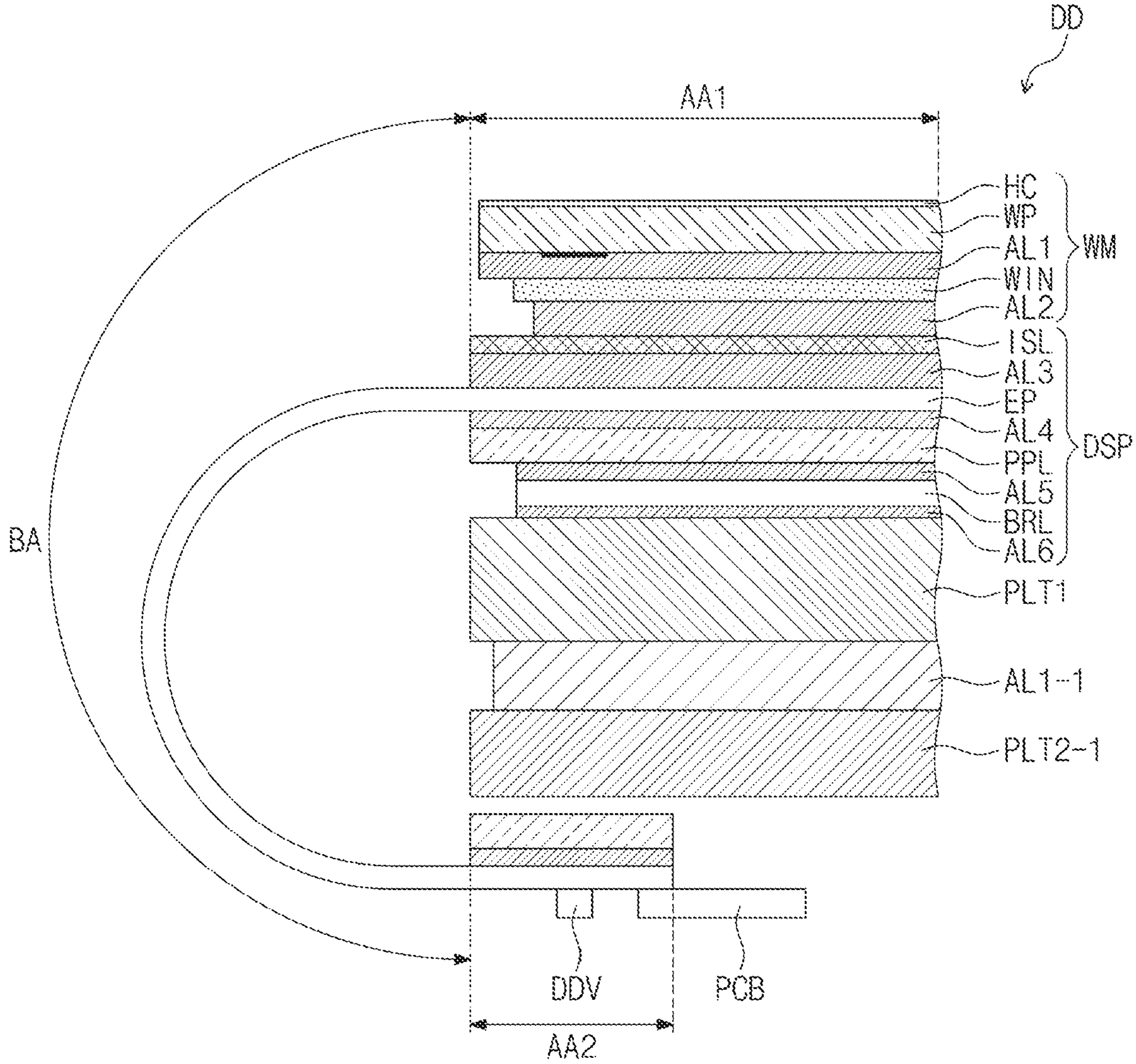
FIG. 11 illustrates a bent state of a bending region illustrated in FIG. 9.

FIG. 9 is a cross-sectional view taken along line I-I' illustrated in FIG. 7. FIG. 10 is a cross-sectional view of another embodiment taken along line I-I' illustrated in FIG. 7 according to the inventive concept. FIG. 11 illustrates a bent state of the bending region illustrated in FIG. 9.

FIG. 9 and FIG. 10 illustrate a cross section of the display module DM and a cross section of the window module WM together, which correspond to the line I-I'.

Referring to FIGS. 9, 10, and 11, the display device DD may include a display module DM and a window module WM disposed on the display module DM. The display module DM may be a flexible display module. The display module DM may include a first non-folding region NFA1, a folding region FA, and a second non-folding region NFA2.

The window module WM may include a window WIN, a window protection layer WP, a hard coating layer HC, and first and second adhesive layers AL1 and AL2.

The display module DM may include a display unit DSP, a first support plate PLT1, a cover layer COV, impact resistant layers IPR, a second support plate PLT2, and a seventh adhesive layer AL7.

Since the configuration of an electronic panel EP and a panel protection layer PPL has been described in detail with reference to FIG. 5, the descriptions thereof will be omitted.

An impact absorbing layer ISL may be disposed on the electronic panel EP. The impact absorbing layer ISL may protect the electronic panel EP by absorbing an external impact applied from above the display device DD toward the electronic panel EP. The impact absorbing layer ISL may be manufactured in the form of a stretchable film.

The impact absorbing layer ISL may include or consist of a flexible plastic material. The flexible plastic material may be defined as a synthetic resin film. In an embodiment, the impact absorbing layer ISL may include or consist of a flexible plastic material such as polyimide ("PI") or polyethylene terephthalate ("PET"), for example.

The window WIN may be disposed on the impact absorbing layer ISL. The window WIN may protect the electronic panel EP from external scratches. The window WIN may have an optically transparent property. The window WIN may include or consist of glass. Without being limited thereto, however, the window WIN may include or consist of a synthetic resin film.

The window WIN may have a multi-layered structure or a single-layered structure. In an embodiment, the window WIN may include a plurality of synthetic resin films bonded together with an adhesive, or may include a glass substrate and a synthetic resin film bonded together with an adhesive, for example.

The window protection layer WP may be disposed on the window WIN. The window protection layer WP may include or consist of a flexible plastic material such as polyimide or polyethylene terephthalate. The hard coating layer HC may be disposed on the upper surface of the window protection layer WP.

A printed layer PIT may be disposed on the lower surface of the window protection layer WP. The printed layer PIT may have a black color, but the color of the printed layer PIT is not limited thereto. The printed layer PIT may be adjacent to an edge of the window protection layer WP.

A barrier layer BRL may be disposed below the panel protection layer PPL. The barrier layer BRL may increase resistance to compressive force caused by external pressure. Accordingly, the barrier layer BRL may serve to prevent deformation of the electronic panel EP. The barrier layer BRL may include or consist of a flexible plastic material such as polyimide or polyethylene terephthalate.

The barrier layer BRL may have a color that absorbs light. In an embodiment, the barrier layer BRL may have a black color. In this case, components disposed below the barrier layer BRL may not be viewed when the display module DM is viewed from above, for example.

A first adhesive layer AL1 may be disposed between the window protection layer WP and the window WIN. The window protection layer WP and the window WIN may be bonded to each other by the first adhesive layer ALL The first adhesive layer AL1 may cover the printed layer PIT.

A second adhesive layer AL2 may be disposed between the window WIN and the impact absorbing layer ISL. The window WIN and the impact absorbing layer ISL may be bonded to each other by the second adhesive layer AL2.

A third adhesive layer AL3 may be disposed between the impact absorbing layer ISL and the electronic panel EP. The impact absorbing layer ISL and the electronic panel EP may be bonded to each other by the third adhesive layer AL3.

A fourth adhesive layer AL4 may be disposed between the electronic panel EP and the panel protection layer PPL. The electronic panel EP and the panel protection layer PPL may be bonded to each other by the fourth adhesive layer AL4.

A fifth adhesive layer AL5 may be disposed between the panel protection layer PPL and the barrier layer BRL. The panel protection layer PPL and the barrier layer BRL may be bonded to each other by the fifth adhesive layer AL5.

A sixth adhesive layer AL6 may be disposed between the barrier layer BRL and the first support plate PLT1. The barrier layer BRL and the first support plate PLT1 may be bonded to each other by the sixth adhesive layer AL6.

The sixth adhesive layer AL6 may overlap the first and second non-folding regions NFA1 and NFA2 and may not overlap the folding region FA. That is, the sixth adhesive layer AL6 may not be disposed in the folding region FA.

The first to sixth adhesive layers AL1 to AL6 may include or consist of a transparent adhesive such as a pressure sensitive adhesive ("PSA") or an optically clear adhesive ("OCA"), but the type of adhesive is not limited thereto.

Hereinafter, in this specification, the term "thickness" may indicate a value measured in the third direction DR3, and the term "width" may indicate a value measured in the first direction DR1 or the second direction DR2, which is a horizontal direction.

The thickness of the panel protection layer PPL may be smaller than that of the window protection layer WP, and the thickness of the barrier layer BRL may be smaller than that of the panel protection layer PPL. The thickness of the electronic panel EP may be smaller than that of the barrier layer BRL and may be equal to that of the window WIN. The thickness of the impact absorbing layer ISL may be smaller than that of the electronic panel EP.

The thickness of the first adhesive layer AL1 may be the same as that of the barrier layer BRL, and the thickness of each of the second and third adhesive layers AL2 and AL3 may be the same as that of the panel protection layer PPL. The thickness of the fourth adhesive layer AL4 may be the same as that of the fifth adhesive layer AL5.

The thickness of each of the fourth adhesive layer AL4 and the fifth adhesive layer AL5 may be smaller than that of the electronic panel EP and greater than that of the impact absorbing layer ISL. The thickness of the sixth adhesive layer AL6 may be smaller than that of the impact absorbing layer ISL. The thickness of the hard coating layer HC may be smaller than that of the sixth adhesive layer AL6.

The electronic panel EP, the impact absorbing layer ISL, the panel protection layer PPL, and the third and fourth adhesive layers AL3 and AL4 may have the same width as each other. The width of the electronic panel EP may refer to the width of a portion of the electronic panel EP disposed in the first region AA1. The window protection layer WP and the first adhesive layer AL1 may have the same width as each other. The barrier layer BRL and the fifth and sixth adhesive layers AL5 and AL6 may have the same width as each other.

The edges of the electronic panel EP, the impact absorbing layer ISL, the panel protection layer PPL, and the third and fourth adhesive layers AL3 and AL4 may be disposed more outward than the edges of the window protection layer WP and the first adhesive layer AL1.

The widths of the window WIN and the second adhesive layer AL2 may be smaller than those of the window protection layer WP and the first adhesive layer AL1. The width of the second adhesive layer AL2 may be smaller than that of the window WIN. The edge of the window WIN may be disposed more inward than the edges of the window protection layer WP and the first adhesive layer AL1. The edge of the second adhesive layer AL2 may be disposed more inward than the edge of the window WIN.

The widths of the barrier layer BRL and the fifth and sixth adhesive layers AL5 and AL6 may be smaller than those of the window protection layer WP and the first adhesive layer AL1. The edges of the barrier layer BRL and the fifth and sixth adhesive layers AL5 and AL6 may be disposed more inward than the edges of the window protection layer WP and the first adhesive layer AL1.

The first support plate PLT1 may be disposed below and support the display unit DSP. The first support plate PLT1 may support the electronic panel EP. In an embodiment, the thickness of the first support plate PLT1 may be about 150 micrometers to about 170 micrometers.

The first support plate PLT1 may have more rigidity than the display unit DSP. The first support plate PLT1 may include or consist of a non-metal material. In an embodiment, the first support plate PLT1 may include or consist of a fiber-reinforced composite material, for example. The fiber-reinforced composite material may be carbon fiber reinforced plastic ("CFRP") or glass fiber reinforced plastic ("GFRP").

The first support plate PLT1 may be lightweight by including a fiber-reinforced composite material. By including the fiber-reinforced composite material, the first support plate PLT1 in an embodiment of the inventive concept may have a lighter weight than a metal support plate including or consisting of a metal material and have an elastic modulus and a strength similar to those of the metal support plate. In an embodiment, the elastic modulus of the first support plate PLT1 may be about 20 gigapascals (GPa) to about 190 GPa, for example.

In addition, since the first support plate PLT1 includes a fiber-reinforced composite material, the shape processing of the first support plate PLT1 may be easy, compared to a metal support plate. In an embodiment, the first support plate PLT1 including the fiber-reinforced composite material may be more easily processed through a laser process or a microblasting process, for example. Without being limited thereto, however, the first support plate PLT1 may be a metal support plate.

A plurality of openings OP may be defined in a portion of the first support plate PLT1 overlapping the folding region FA. The openings OP may be formed by passing through portions of the first support plate PLT1 in the third direction DR3. The openings OP may be formed through the aforementioned laser process or microblasting process.

Since the openings OP are defined in a portion of the first support plate PLT1 overlapping the folding region FA, the flexibility of the portion of the first support plate PLT1 overlapping the folding region FA may be increased. As a result, the first support plate PLT1 may be easily folded around the folding region FA. The openings OP will be described in detail with reference to FIGS. 17A and 17B.

The cover layer COV may be disposed below the first support plate PLT1. Under the first support plate PLT1, the cover layer COV may cover the openings OP defined in the first support plate PLT1. In a plan view, the cover layer COV may overlap the folding region FA and may not overlap the first and second non-folding regions NFA1 and NFA2. That is, the cover layer COV may not be disposed on the first and second non-folding regions NFA1 and NFA2. The cover layer COV may come in contact with the lower surface of a portion of the first support plate PLT1, in which the openings OP are formed.

The cover layer COV may have a lower elastic modulus than the first support plate PLT1. In an embodiment, the cover layer COV may include or consist of thermoplastic polyurethane or rubber, for example, but the material of the cover layer COV is not limited thereto. The cover layer COV may be manufactured in a sheet form and attached to the first support plate PLT1.

A seventh adhesive layer AL7 may be disposed between the first support plate PLT1 and the cover layer COV. The first support plate PLT1 and the cover layer COV may be adhered to each other by the seventh adhesive layer AL7. In an embodiment, in a plan view, the seventh adhesive layer AL7 may overlap the folding region FA. In this case, the seventh adhesive layer AL7 may not overlap the first non-folding region NFA1 and the second non-folding region NFA2. Without being limited thereto, however, the seventh adhesive layer AL7 may not be disposed in the folding region FA. That is, the seventh adhesive layer AL7 may be opened in the folding region FA. The aforementioned cover layer COV may be disposed in the opening of the seventh adhesive layer AL7.

The impact resistant layers IPR may be disposed below the first support plate PLT1. In an embodiment of the inventive concept, the impact resistant layers IPR may be a first-first adhesive layer AL1-1 and a first-second adhesive layer AL1-2. The first-first adhesive layer AL1-1 and the first-second adhesive layer AL1-2 may be disposed directly on the lower surface of the first support plate PLT1. The first-first adhesive layer AL1-1 and the first-second adhesive layer AL1-2 may be separated from each other in the folding region FA. In an embodiment, in a plan view, the first-first adhesive layer AL1-1 may overlap the first non-folding region NFA1, and the first-second adhesive layer AL1-2 may overlap the second non-folding region NFA2, for example. The first-first and first-second adhesive layers AL1-1 and AL1-2 may not overlap the folding region FA. In this case, the cover layer COV and the seventh adhesive layer AL7 may be disposed between the first-first adhesive layer AL1-1 and the first-second adhesive layer AL1-2 arranged in the second direction DR2.

The thicknesses of the first-first adhesive layer AL1-1 and the first-second adhesive layer AL1-2 may be about 40 micrometers to about 300 micrometers. The elastic moduli of the first-first adhesive layer AL1-1 and the first-second adhesive layer AL1-2 may be about 20 megapascals (MPa) to about 1 GPa.

A second support plate PLT2 may be disposed below the first-first adhesive layer AL1-1 and the first-second adhesive layer AL1-2. The second support plate PLT2 may be disposed directly on the lower surfaces of the first-first adhesive layer AL1-1 and the first-second adhesive layer AL1-2.

The second support plate PLT2 may be separated into two in the folding region FA. In an embodiment, in a plan view, the second support plate PLT2 may include a second-first support plate PLT2-1 overlapping the first non-folding region NFA1 and a second-second support plate PLT2-2 overlapping the second non-folding region NFA2, for example.

The first-first adhesive layer AL1-1 may be disposed between the first support plate PLT1 and the second-first support plate PLT2-1. The first-second adhesive layer AL1-2 may be disposed between the first support plate PLT1 and the second-second support plate PLT2-2. Each of the first-first adhesive layer AL1-1 and the first-second adhesive layer AL1-2 may be disposed directly on the upper surface of a corresponding support plate of the second-first support plate PLT2-1 and the second-second support plate PLT2-2.

The second-first support plate PLT2-1 may support the first non-folding region NFA1. The second-second support plate PLT2-2 may support the second non-folding region NFA2. The second-first support plate PLT2-1 and the second-second support plate PLT2-2 may extend to the folding region FA and be disposed adjacent to each other in the folding region FA.

The second-first support plate PLT2-1 and the second-second support plate PLT2-2 may be spaced apart from each other below the folding region FA. In an embodiment, the distance between the second-first support plate PLT2-1 and the second-second support plate PLT2-2 in the horizontal direction may be about 0.4 millimeter (mm) to about 2 mm.

The second-first support plate PLT2-1 and the second-second support plate PLT2-2 may support a portion of the first support plate PLT1 in which the openings OP are defined below the folding region FA. When pressure is applied to the first support plate PLT1 from above, deformation of a portion of the first support plate PLT1, which has the openings OP defined therein, may be prevented due to the second-first support plate PLT2-1 and the second-second support plate PLT2-2. Additionally, the second-first and second-second support plates PLT2-1 and PLT2-2 may perform a heat dissipation function.

The second support plate PLT2 may have more rigidity than the display unit DSP. The second support plate PLT2 may include or consist of a metal material such as stainless steel (e.g., SUS 316), but the metal material of the second support plate PLT2 is not limited thereto. In addition, without being limited thereto, the second support plate PLT2 may include or consist of a non-metal material such as carbon fiber reinforced plastic.

In an embodiment, the elastic modulus of the second support plate PLT2 may be about 20 GPa to about 190 GPa. In addition, the thickness of the second support plate PLT2 may be about 50 micrometers.

The first support plate PLT1 and the second support plate PLT2 may have the same width as each other. The widths of the first-first adhesive layer AL1-1 and the first-second adhesive layer AL1-2 may be smaller than those of the first support plate PLT1 and the second support plate PLT2. The first-first adhesive layer AL1-1 and the first-second adhesive layer AL1-2 may be disposed more inward than the edges of the first support plate PLT1 and the second support plate PLT2.

Referring to FIGS. 9 and 10, as illustrated in FIG. 9, the thicknesses of the first-first adhesive layer AL1-1 and the first-second adhesive layer AL1-2 may be smaller than those of the first support plate PLT1 and the second support plate PLT2. The thickness of the second support plate PLT2 may be smaller than the thickness of the first support plate PLT1. As illustrated in FIG. 10, however, the thicknesses of the first-first adhesive layer AL1-1 and the first-second adhesive layer AL1-2 may be greater than the thicknesses of the first and second support plates PLT1 and PLT2. In addition, without being limited thereto, the thicknesses of the first-first adhesive layer AL1-1 and the first-second adhesive layer AL1-2 may be smaller than that of the first support plate PLT1 and greater than that of the second support plate PLT2. The sum of the thicknesses of the cover layer COV and the seventh adhesive layer AL7 may be smaller than the thickness of each of the first-first adhesive layer AL1-1 and the first-second adhesive layer AL1-2.

When the thickness of each of the first-first adhesive layer AL1-1 and the first-second adhesive layer AL1-2 is less than about 40 micrometers, the impact resistance of the display device DD may be weakened. Therefore, when an external impact is applied to the display module DM (refer to FIG. 7), the display device DD may be damaged. In order to improve the impact resistance of the display device DD, the thickness of any one layer disposed in the first and second non-folding regions NFA1 and NFA2 and the folding region FA above the first support plate PLT1 may be increased. In this case, however, the thickness of any one layer in the folding region FA may also be increased. When the thickness of the folding region FA is increased, the folding operation of the display device DD may be difficult.

The display device DD in an embodiment of the inventive concept may include impact resistant layers IPR disposed between the first support plate PLT1 and the second support plate PLT2 and separated from each other in the folding region FA. The thicknesses of the impact resistant layers IPR, which are not disposed in the folding region FA, may be increased. Since the impact resistant layers IPR are not disposed in the folding region FA, they may not affect folding operation. In addition, as the thickness of the impact resistant layers IPR having a predetermined elasticity increases, the impact resistance of the display device DD may be improved. That is, although an external impact is applied to the display device DD, the impact resistant layers IPR may support the display unit DSP as they are disposed below the display unit DSP.

TABLE 1

| | Thickness of impact resistant layers | |
|---|---|---|
| | 20 μm | 40 μm |
| TFE strain (%) | 0.5% | 0.44% |

Table 1 shows an experimental example for confirming impact resistance. The test for confirming impact resistance may be performed by dropping a pen or a ball. Impact resistance may be defined as a property of withstanding an external impact. The pen drop test may be a test in which a pen is dropped on the display device DD of FIG. 9 at different heights. The pen may be dropped from the same height toward the display device DD including impact resistant layers IPR having different thicknesses.

Strain indicates the degree of deformation of an object, which is caused by an external impact. The strain of a thin film encapsulation layer TFE may be defined as a ratio of an amount of deformation of the thin film encapsulation layer TFE, which is caused by an impact, to an initial state of the thin film encapsulation layer TFE.

Referring to Table 1, when the thickness of the impact resistant layers IPR is about 20 micrometers, the strain of the thin film encapsulation layer TFE (refer to FIG. 6) may be about 0.5%.

When the thickness of the impact resistant layers IPR is about 40 micrometers, the strain of the thin film encapsulation layer TFE (refer to FIG. 6) may be about 0.44%. By referring to Table 1, it may be confirmed that, when the thickness of the impact resistant layers IPR disposed between the first support plate PLT1 and the second support plate PLT2 is increased, the strain of the display module DM may be reduced although an external impact is applied thereto.

Therefore, by increasing the thickness of the impact resistant layers IRP disposed between the first support plate PLT1 and the second support plate PLT2, the impact resistance of the display device DD may be improved, and although an external impact is applied thereto, the possibility of damage to the display module DM may be reduced.

FIG. 11 illustrates a bent state of the bending region illustrated in FIG. 9.

FIG. 11 illustrates a portion of the display unit DSP, a portion of the window module WM, a portion of the first support plate PLT1, the first-first adhesive layer AL1-1, and the second-first support plate PLT2-1.

Since a display unit DSP, a window module WM, a first support plate PLT1, a first-first adhesive layer AL1-1, and a second-first support plate PLT2-1 of FIG. 11 are the same as the display unit DSP, the window module WM, the first support plate PLT1, the first-first adhesive layer AL1-1, and the second-first support plate PLT2-1, the descriptions thereof will be omitted or simplified.

Referring to FIG. 11, the panel protection layer PPL and the fourth adhesive layer AL4 may not be disposed below the bending region BA. The panel protection layer PPL and the fourth adhesive layer AL4 may be disposed below the second region AA2 of the electronic panel EP. The data driver DDV may be disposed on the second region AA2 of the electronic panel EP.

A printed circuit board PCB may be connected to the second region AA2 of the electronic panel EP. The printed circuit board PCB may be connected to one side of the second region AA2. The bending region BA may be bent so that the second region AA2 may be disposed below the first region AA1. Therefore, the data driver DDV and the printed circuit board PCB may be disposed below the first region AA1.

Figure 12:
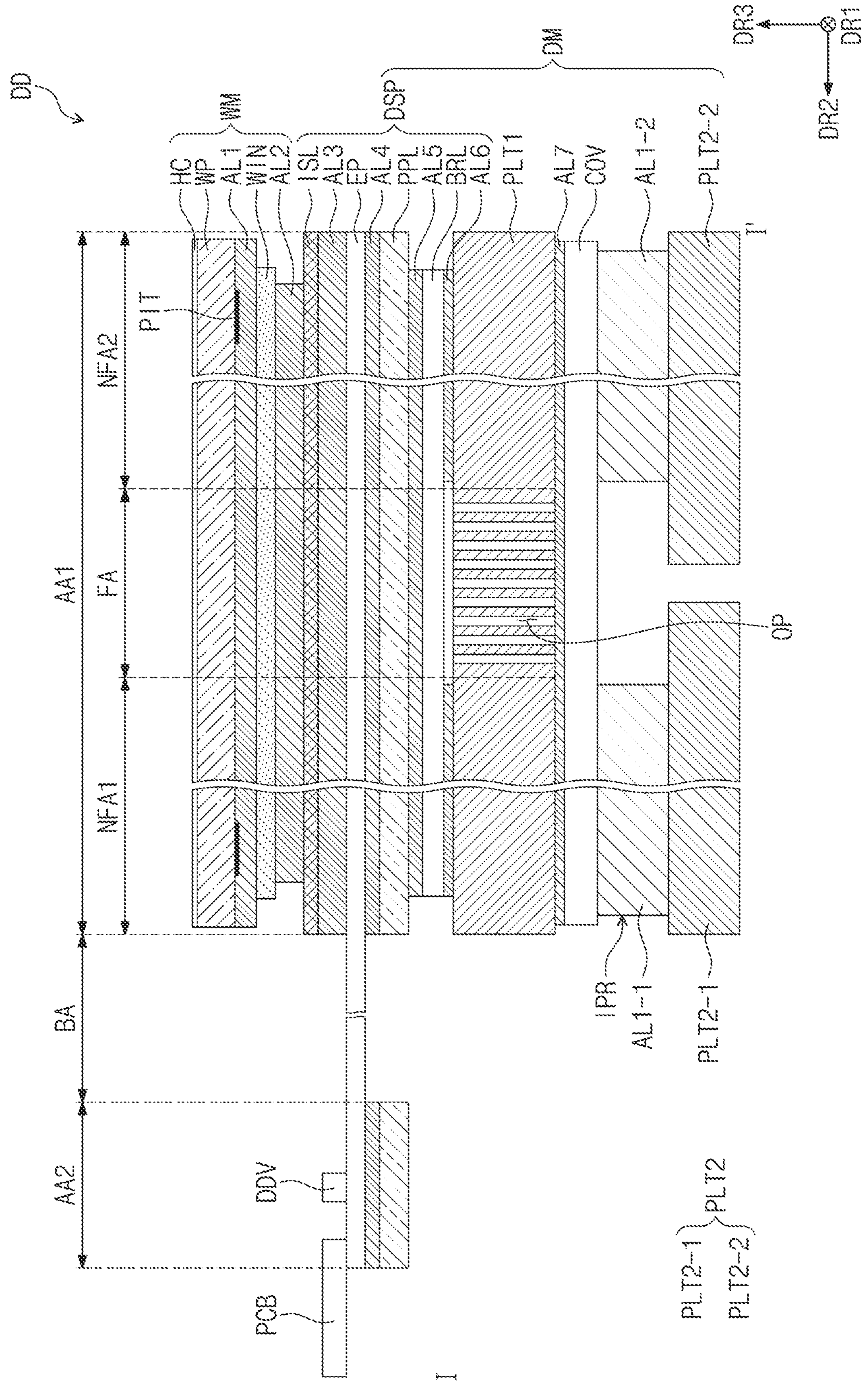
FIG. 12 is a cross-sectional view of another embodiment taken along line I-I' illustrated in FIG. 7 according to the inventive concept.

FIG. 12 is a cross-sectional view of another embodiment taken along line I-I' illustrated in FIG. 7 according to the inventive concept.

FIG. 12 illustrates a cross section of the display module DM and a cross section of the window module WM together, which correspond to the line I-I'.

Since a window module WM, a display unit DSP, a first support plate PLT1, a data driver DDV, a printed circuit board PCB, and a second support plate PLT2 of FIG. 12 are the same as the window module WM, the display unit DSP, the first support plate PLT1, the data driver DDV, the printed circuit board PCB, and the second support plate PLT2 of FIGS. 9 and 11, the descriptions thereof will be omitted or simplified.

Referring to FIG. 12, the cover layer COV may be disposed below the first support plate PLT1. In a plan view, the cover layer COV may overlap the first non-folding region NFA1, the folding region FA, and the second non-folding region NFA2. The cover layer COV may be disposed between the first-first adhesive layer AL1-1 and the first support plate PLT1 and between the first-second adhesive layer AL1-2 and the first support plate PLT1.

The seventh adhesive layer AL7 may be disposed below the first support plate PLT1. The seventh adhesive layer AL7 may be disposed between the first support plate PLT1 and the cover layer COV. The seventh adhesive layer AL7 may be disposed directly on the lower surface of the first support plate PLT1. The seventh adhesive layer AL7 may be disposed directly on the upper surface of the cover layer COV. In a plan view, the seventh adhesive layer AL7 may overlap the first non-folding region NFA1, the folding region FA, and the second non-folding region NFA2.

The first-first adhesive layer AL1-1 and the first-second adhesive layer AL1-2 may be disposed below the cover layer COV. The first-first adhesive layer AL1-1 and the first-second adhesive layer AL1-2 may be disposed directly on the lower surface of the cover layer COV. The first-first adhesive layer AL1-1 may overlap the first non-folding region NFA1. The first-second adhesive layer AL1-2 may overlap the second non-folding region NFA2. The first-first and first-second adhesive layers AL1-1 and AL1-2 may not overlap the folding region FA.

The thicknesses of the first-first adhesive layer AL1-1 and the first-second adhesive layer AL1-2 may be about 40 micrometers to about 300 micrometers.

The second support plate PLT2 may be disposed below the first-first adhesive layer AL1-1 and the first-second adhesive layer AL1-2. The first-first adhesive layer AL1-1 and the first-second adhesive layer AL1-2 may be disposed directly on the upper surface of the second support plate PLT2. The second support plate PLT2 may include a second-first support plate PLT2-1 and a second-second support plate PLT2-2. The second-first support plate PLT2-1 and the second-second support plate PLT2-2 may extend to the folding region FA and be disposed adjacent to each other in the folding region FA. The second-first support plate PLT2-1 and the second-second support plate PLT2-2 may be spaced apart from each other below the folding region FA.

The widths of the seventh adhesive layer AL7 and the cover layer COV may be the same as each other. The widths of the seventh adhesive layer AL7 and the cover layer COV may be smaller than that of the first support plate PLT1. The seventh adhesive layer AL7 and the cover layer COV may be disposed more inward than the edge of the first support plate PLT1.

The widths of the first-first adhesive layer AL1-1 and the first-second adhesive layer AL1-2 may be smaller than that of the cover layer COV. The first-first adhesive layer AL1-1 and the first-second adhesive layer AL1-2 may be disposed more inward than the edges of the seventh adhesive layer AL7 and the cover layer COV.

In an embodiment, the thicknesses of the first-first adhesive layer AL1-1 and the first-second adhesive layer AL1-2 may be smaller than the thickness of the first support plate PLT1 and greater than the thickness of the second support plate PLT2. Without being limited thereto, however, the thicknesses of the first-first adhesive layer AL1-1 and the first-second adhesive layer AL1-2 may be greater than or smaller than the thicknesses of the first support plate PLT1 and the second support plate PLT2. The sum of the thicknesses of the seventh adhesive layer AL7 and the cover layer COV may be smaller than the thickness of each of the first-first adhesive layer AL1-1 and the first-second adhesive layer AL1-2.

Since the thicknesses of the first-first adhesive layer AL1-1 and the first-second adhesive layer AL1-2 are about 40 micrometers to about 300 micrometers, the impact resistance of the display device DD may be improved, and although an external impact is applied thereto, the possibility of damage to the display device DD may be reduced.

Figure 13:
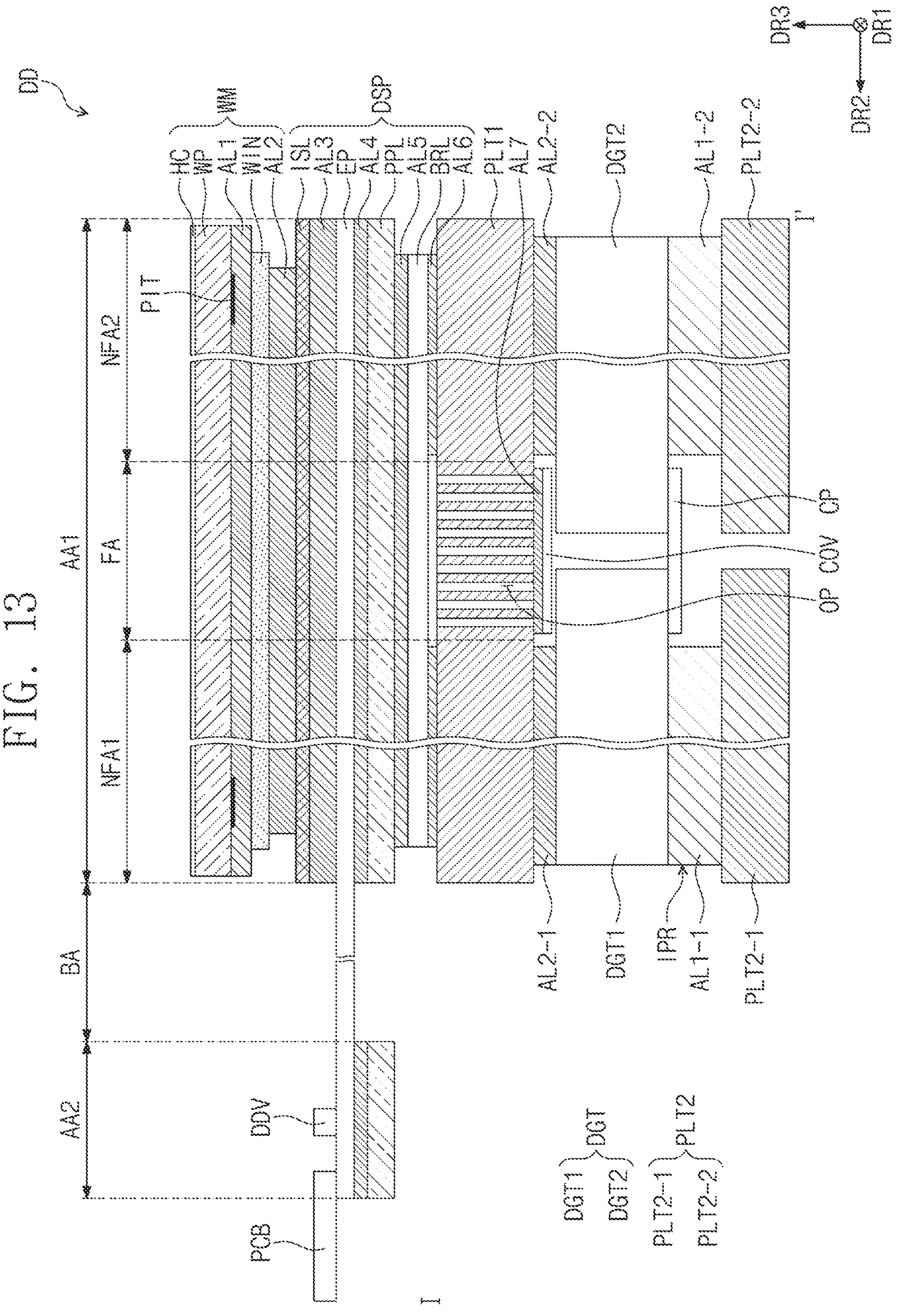
FIG. 13 is a cross-sectional view taken of another embodiment along line I-I' illustrated in FIG. 7 according to the inventive concept.

FIG. 13 is a cross-sectional view of another embodiment taken along line I-I' illustrated in FIG. 7 according to the inventive concept.

FIG. 13 illustrates a cross section of the display module DM and a cross section of the window module WM together, which correspond to the line I-I'.

Since a window module WM, a display unit DSP, a data driver DDV, a printed circuit board PCB, a seventh adhesive layer AL7, a cover layer COV, and a second support plate PLT2 of FIG. 13 are the same as the window module WM, the display unit DSP, the data driver DDV, the printed circuit board PCB, the seventh adhesive layer AL7, the cover layer COV and the second support plate PLT2 of FIGS. 9 and 11, the descriptions thereof will be omitted or simplified.

Referring to FIGS. 1 and 13, the first support plate PLT1 of FIG. 13 may include or consist of a fiber-reinforced composite material. In an embodiment, the first support plate PLT1 may include or consist of CFRP or GFRP.

The display device DD may further include a digitizer DGT. The digitizer DGT may be disposed below the first support plate PLT1. The cover layer COV may be spaced apart from the upper surface of the digitizer DGT. In an embodiment, the thickness of the digitizer DGT may be about 123 micrometers to about 202 micrometers.

The digitizer DGT may receive position information indicated by a user on a display surface. The operation of the digitizer DGT may be implemented in an electromagnetic method (or an electromagnetic resonance method). In an embodiment, the digitizer DGT may include a digitizer sensor substrate (not illustrated) including a plurality of coils, for example. Without being limited thereto, however, the operation of the digitizer DGT may be implemented in an active electrostatic method.

When a user moves a pen on the display device DD, the pen may be driven by an alternating current signal so as to generate a vibrating magnetic field, and the vibrating magnetic field may induce a signal to the coils. The position of the pen may be detected through the signal induced in the coils. The digitizer DGT may obtain the position of the pen by detecting an electromagnetic change caused by the approach of the pen.

When the first support plate PLT1 disposed on and adjacent to the digitizer DGT includes or consists of a metal, the sensitivity of the digitizer DGT may be lowered by the metal. In an embodiment, when a signal transmitted on the display device DD is blocked due to signal interference by a metal support plate, the digitizer DGT may not operate normally, for example. In an embodiment of the inventive concept, however, since the first support plate PLT1 disposed on the digitizer DGT includes or consists of a non-metal fiber-reinforced composite material, the digitizer DGT may operate normally.

The digitizer DGT may be separated into two in the folding region FA. The digitizer DGT may include a first digitizer DGT1 disposed below the first non-folding region NFA1 and a second digitizer DGT2 disposed below the second non-folding region NFA2. In a plan view, the first digitizer DGT1 may overlap the first non-folding region NFA1. In a plan view, the second digitizer DGT2 may overlap the second non-folding region NFA2.

The digitizer DGT may further include a connection part CP. The connection part CP may be disposed below the first and second digitizers DGT1 and DGT2. The connection part CP may overlap the folding region FA. The connection part CP may be disposed adjacent to the edges of the first and second digitizers DGT1 and DGT2, which face each other. The connection part CP may be a flexible circuit board. The first digitizer DGT1 and the second digitizer DGT2 may be connected to each other by a plurality of flexible circuit boards.

The second-first adhesive layer AL2-1 and the second-second adhesive layer AL2-2 may be disposed between the first support plate PLT1 and the digitizer DGT. In a plan view, the second-first adhesive layer AL2-1 may overlap the first non-folding region NFA1. In a plan view, the second-second adhesive layer AL2-2 may overlap the second non-folding region NFA2. In a plan view, the second-first adhesive layer AL2-1 and the second-second adhesive layer AL2-2 may not overlap the folding region FA. The seventh adhesive layer AL7 and the cover layer COV may be disposed between the second-first adhesive layer AL2-1 and the second-second adhesive layer AL2-2.

The second-first adhesive layer AL2-1 may be disposed directly on the lower surface of the first support plate PLT1 and the upper surface of the first digitizer DGT1. The second-second adhesive layer AL2-2 may be disposed directly on the lower surface of the first support plate PLT1 and the upper surface of the second digitizer DGT2. In an embodiment, the thickness of each of the second-first adhesive layer AL2-1 and the second-second adhesive layer AL2-2 may be about 20 micrometers.

The first-first adhesive layer AL1-1 and the first-second adhesive layer AL1-2 may be disposed below the digitizer DGT. The first-first adhesive layer AL1-1 and the first-second adhesive layer AL1-2 may be disposed directly on the lower surface of the digitizer DGT. The first-first adhesive layer AL1-1 may overlap the first non-folding region NFA1. The first-second adhesive layer AL1-2 may overlap the second non-folding region NFA2. The first-first and first-second adhesive layers AL1-1 and AL1-2 may not overlap the folding region FA. The thicknesses of the first-first adhesive layer AL1-1 and the first-second adhesive layer AL1-2 may be about 40 micrometers to about 300 micrometers. The thickness of each of the second-first adhesive layer AL2-1 and the second-second adhesive layer AL2-2 may be smaller than the thickness of each of the first-first adhesive layer AL1-1 and the first-second adhesive layer AL1-2.

The second support plate PLT2 may be disposed below the first-first adhesive layer AL1-1 and the first-second adhesive layer AL1-2. The first-first adhesive layer AL1-1 and the first-second adhesive layer AL1-2 may be disposed directly on the upper surface of the second support plate PLT2. The second support plate PLT2 may include a second-first support plate PLT2-1 and a second-second support plate PLT2-2. The second-first support plate PLT2-1 and the second-second support plate PLT2-2 may extend to the folding region FA and be disposed adjacent to each other in the folding region FA. The second-first support plate PLT2-1 and the second-second support plate PLT2-2 may be spaced apart from each other below the folding region FA.

The widths of the second-first adhesive layer AL2-1, the second-second adhesive layer AL2-2, and the digitizer DGT may be the same as each other. The widths of the second-first adhesive layer AL2-1 and the second-second adhesive layer AL2-2 and the widths of the first-first adhesive layer AL1-1 and the first-second adhesive layer AL1-2 may be the same as each other. The widths of the second-first adhesive layer AL2-1 and the second-second adhesive layer AL2-2 may be smaller than those of the first support plate PLT1 and the second support plate PLT2. The digitizer DGT may be disposed more inward than the edges of the first and second support plates PLT1 and PLT2.

The thicknesses of the first-first adhesive layer AL1-1 and the first-second adhesive layer AL1-2 may be greater than the thicknesses of the second-first adhesive layer AL2-1 and the second-second adhesive layer AL2-2. In an embodiment, the thicknesses of the first support plate PLT1 and the second support plate PLT2 may be smaller than the thickness of the digitizer DGT. Without being limited thereto, however, the thicknesses of the first-first adhesive layer AL1-1 and the first-second adhesive layer AL1-2 may be greater than the thickness of the digitizer DGT.

Since the thicknesses of the first-first adhesive layer AL1-1 and the first-second adhesive layer AL1-2 are about 40 micrometers to about 300 micrometers, the impact resistance of the display device DD may be improved, and although an external impact is applied thereto, the possibility of damage to the display module DM may be reduced.

Figure 14:
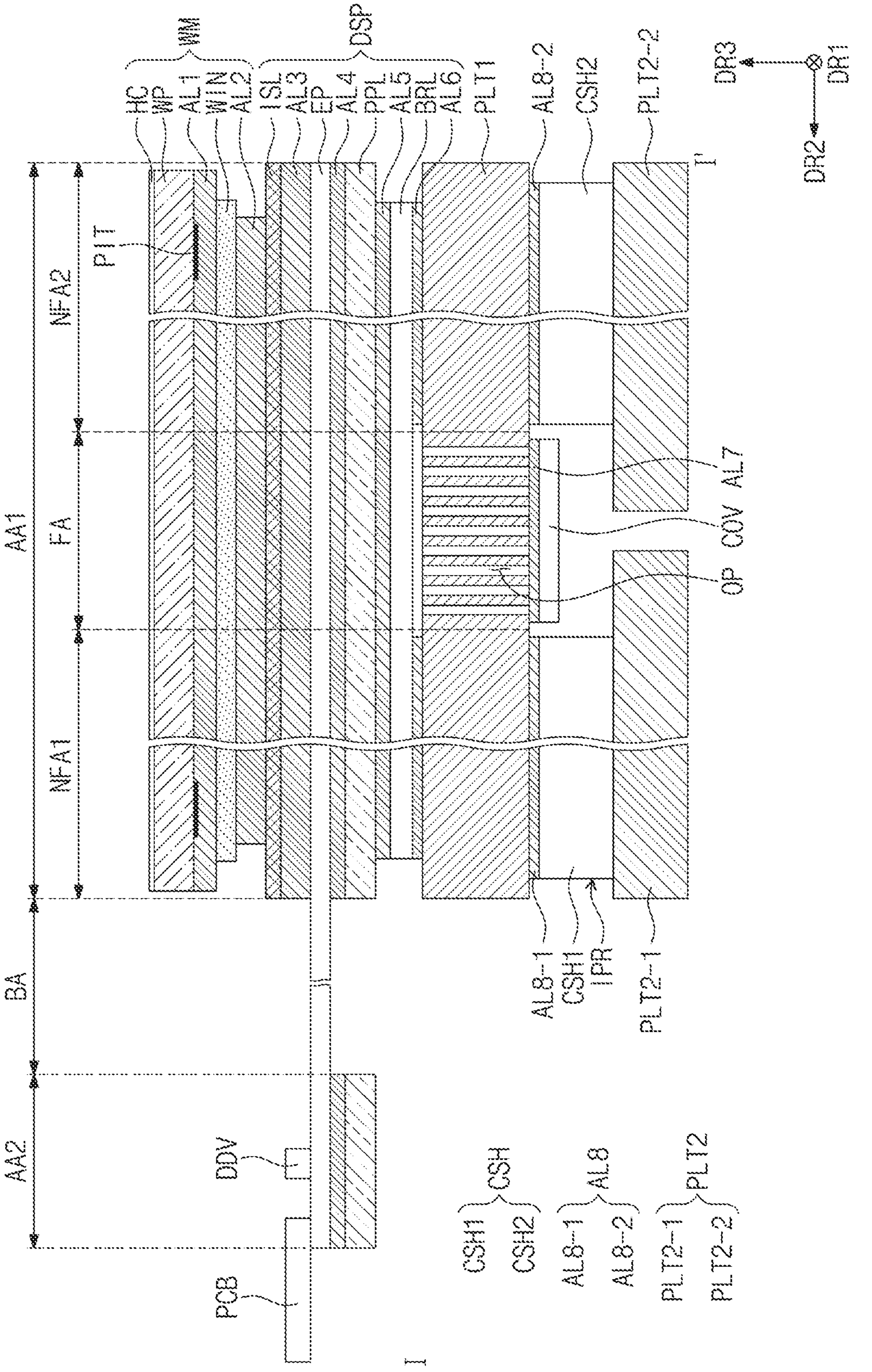
FIG. 14 is a cross-sectional view of another embodiment taken along line I-I' illustrated in FIG. 7 according to the inventive concept.

FIG. 14 is a cross-sectional view of another embodiment taken along line I-I' illustrated in FIG. 7 according to the inventive concept.

FIG. 14 illustrates a cross section of the display module DM and a cross section of the window module WM together, which correspond to the line I-I'.

Since a seventh adhesive layer AL7, a cover layer COV, a window module WM, a display unit DSP, a first support plate PLT1, and a second support plate PLT2 of FIG. 14 are the same as the seventh adhesive layer AL7, the cover layer COV, the window module WM, the display unit DSP, the first support plate PLT1, and the second support plate PLT2, the descriptions thereof will be omitted or simplified.

Referring to FIGS. 1 and 14, the display device DD may further include an eighth adhesive layer AL8 and a cushion layer CSH. In an embodiment of the inventive concept, the impact resistant layers IPR may be cushion layers CSH. The cushion layers CSH may be disposed below the first support plate PLT1.

The cushion layers CSH may include a first cushion layer CSH1 and a second cushion layer CSH2. In a plan view, the first cushion layer CSH1 may overlap the first non-folding region NFA1. In a plan view, the second cushion layer CSH2 may overlap the second non-folding region NFA2. In a plan view, the first and second cushion layers CSH1 and CSH2 may not overlap the folding region FA.

Each of the first cushion layer CSH1 and the second cushion layer CSH2 may include or consist of foam, sponge, polyurethane, or thermoplastic polyurethane. The thickness of each of the first cushion layer CSH1 and the second cushion layer CSH2 may be about 40 micrometers to about 300 micrometers.

The eighth adhesive layer AL8 may be disposed between the first support plate PLT1 and the cushion layer CSH. The eighth adhesive layer AL8 may include an eighth-first adhesive layer AL8-1 and an eighth-second adhesive layer AL8-2.

In a plan view, the eighth-first adhesive layer AL8-1 may overlap the first non-folding region NFA1. The eighth-first adhesive layer AL8-1 may be disposed directly on the lower surface of the first support plate PLT1 and the upper surface of the first cushion layer CSH1.

In a plan view, the eighth-second adhesive layer AL8-2 may overlap the second non-folding region NFA2. The eighth-second adhesive layer AL8-2 may be disposed directly on the lower surface of the first support plate PLT1 and the upper surface of the second cushion layer CSH2.

The cover layer COV and the seventh adhesive layer AL7 may be disposed between the eighth-first adhesive layer AL8-1 and the eighth-second adhesive layer AL8-2. The cover layer COV and the seventh adhesive layer AL7 may be disposed between the first cushion layer CSH1 and the second cushion layer CSH2.

The second support plate PLT2 may be disposed below the cushion layer CSH. The second-first support plate PLT2-1 may be disposed directly on the lower surface of the first cushion layer CSH1. The second-second support plate PLT2-2 may be disposed directly on the lower surface of the second cushion layer CSH2.

The second-first support plate PLT2-1 and the second-second support plate PLT2-2 may extend to the folding region FA and be disposed adjacent to each other in the folding region FA. The second-first support plate PLT2-1 and the second-second support plate PLT2-2 may be spaced apart from each other below the folding region FA. In an embodiment, the thickness of the second support plate PLT2 may be about 50 micrometers.

The width of the cushion layer CSH and the width of the eighth adhesive layer AL8 may be equal to each other. The width of the cushion layer CSH may be smaller than those of the first and second support plates PLT1 and PLT2.

In an embodiment, the thickness of the cushion layer CSH may be smaller than the thickness of the first support plate PLT1 and greater than the thickness of the second support plate PLT2, but is not limited thereto, and the thickness of the cushion layer CSH may be greater than the thicknesses of the first and second support plates PLT1 and PLT2.

As the thickness of the cushion layer CHS is about 40 micrometers to about 300 micrometers, the impact resistance of the display device DD may be improved, and although an external impact is applied thereto, the possibility of damage to the display module DM may be reduced.

Figure 15:
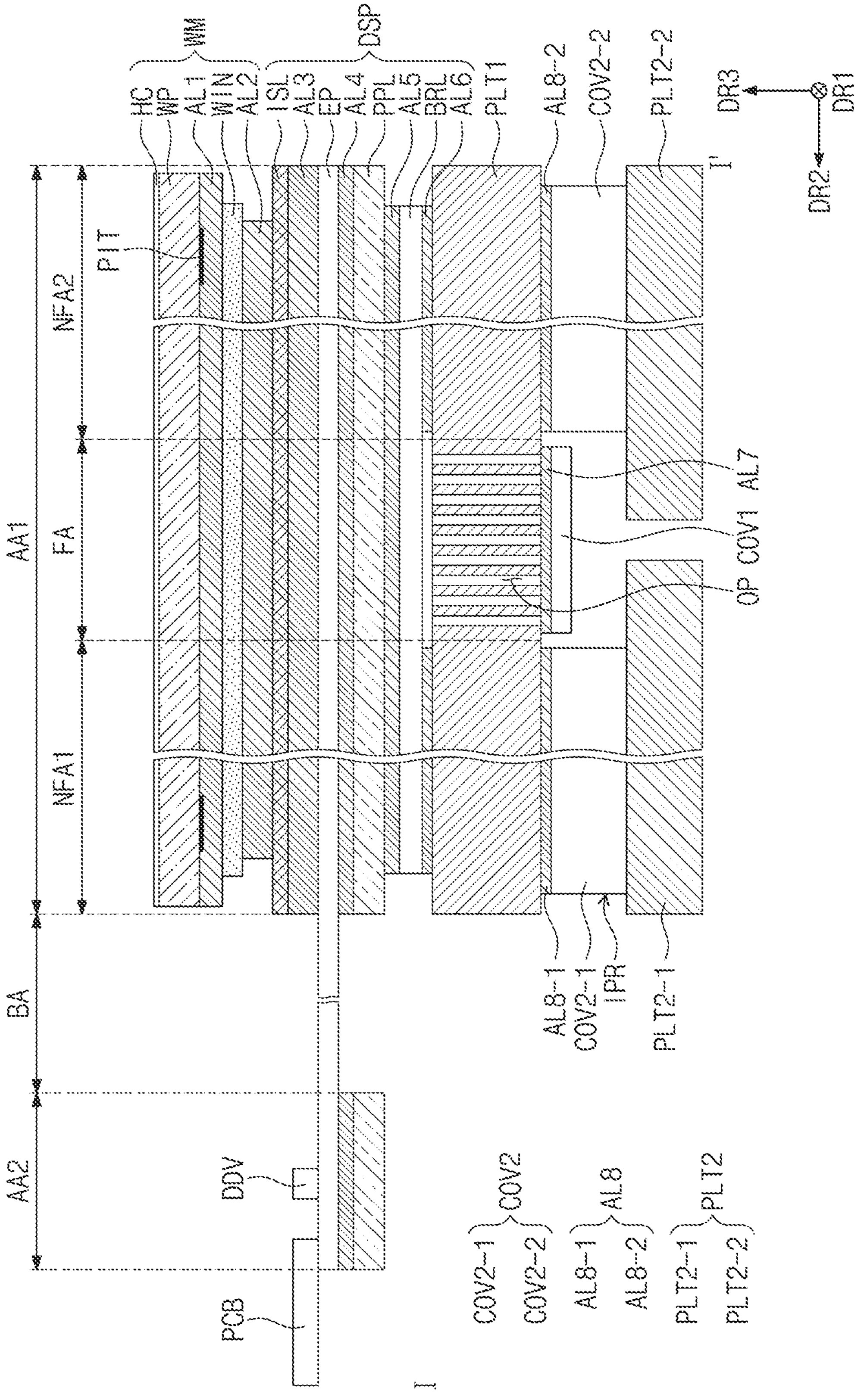
FIG. 15 is a cross-sectional view of another embodiment taken along line I-I' illustrated in FIG. 7 according to the inventive concept.

FIG. 15 is a cross-sectional view of another embodiment taken along line I-I' illustrated in FIG. 7 according to the inventive concept.

FIG. 15 illustrates a cross section of the display module DM and a cross section of the window module WM together, which correspond to the line I-I'.

Since a window module WM, a display unit DSP, a cover layer COV, a seventh adhesive layer AL7, a second support plate PLT2, and an eighth adhesive layer AL8 of FIG. 15 are the same as the window module WM, the display unit DSP, the cover layer COV, the seventh adhesive layer AL7, the second support plate PLT2, and the eighth adhesive layer AL8 of FIG. 14, the descriptions thereof will be omitted or simplified.

In an embodiment, the cover layer COV (refer to FIG. 14) overlapping the folding region FA may be defined as a first cover layer COV1.

Referring to FIGS. 1 and 15, the display device DD may include a second cover layer COV2. The second cover layer COV2 may be disposed below the first support plate PLT1. Hereinafter, the impact resistant layer IPR may be the second cover layer COV2.

The second cover layer COV2 may include a second-first cover layer COV2-1 and a second-second cover layer COV2-2. In a plan view, the second-first cover layer COV2-1 may overlap the first non-folding region NFA1. In a plan view, the second-second cover layer COV2-2 may overlap the second non-folding region NFA2. In a plan view, the second-first and second-second cover layers COV2-1 and COV2-2 may not overlap the folding region FA. The thickness of each of the second-first cover layer COV2-1 and the second-second cover layer COV2-2 may be about 40 micrometers to about 300 micrometers.

The eighth adhesive layer AL8 may be disposed between the second cover layer COV2 and the first support plate PLT1. The second support plate PLT2 may be disposed below the second cover layer COV2.

The width of the second cover layer COV2 and the width of the eighth adhesive layer AL8 may be equal to each other. The width of the second cover layer COV2 may be smaller than those of the first and second support plates PLT1 and PLT2. The second cover layer COV2 may be disposed more inward than the edges of the first and second support plates PLT1 and PLT2.

In an embodiment, the thickness of the second cover layer COV2 may be smaller than the thickness of the first support plate PLT1 and greater than the thickness of the second support plate PLT2, but is not limited thereto, and the thickness of the second cover layer COV2 may be greater than those of the first and second support plates PLT1 and PLT2.

As the thickness of the second cover layer COV2 is about 40 micrometers to about 300 micrometers, the impact resistance of the display device DD may be improved, and although an external impact is applied thereto, the possibility of damage to the display module DM may be reduced.

Figure 16:
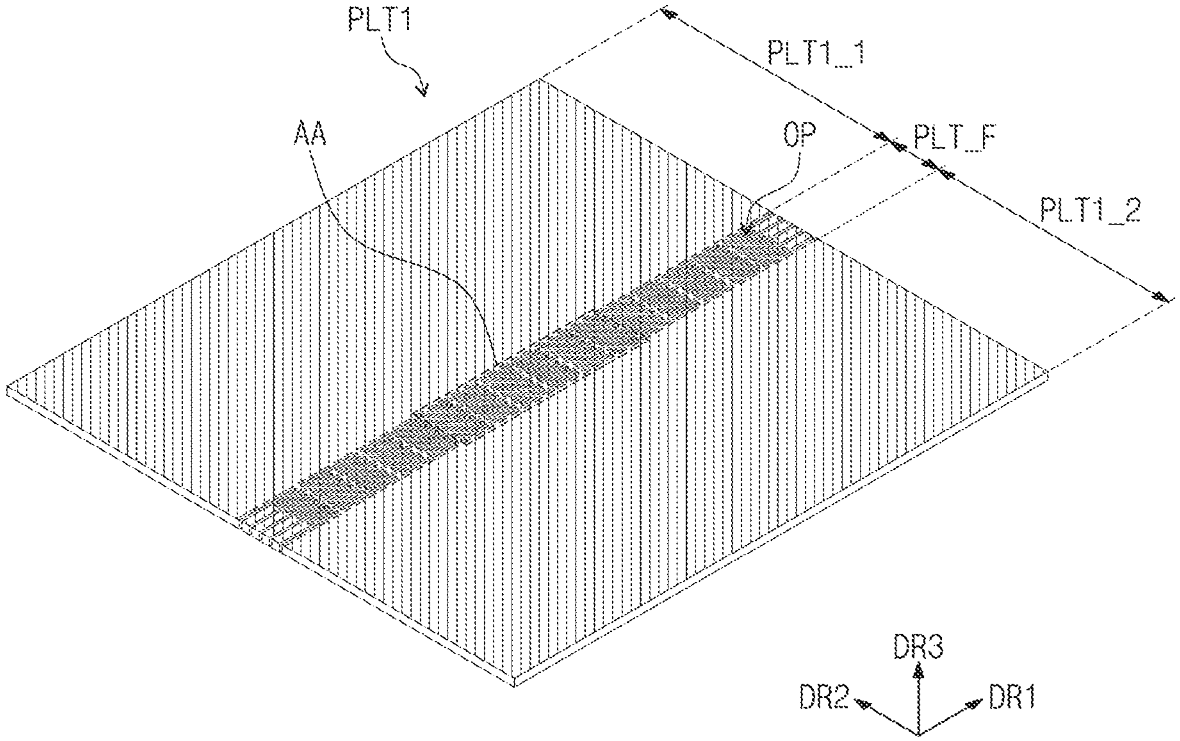
FIG. 16 is a perspective view of a first support plate illustrated in FIG. 9.
Figure 17:
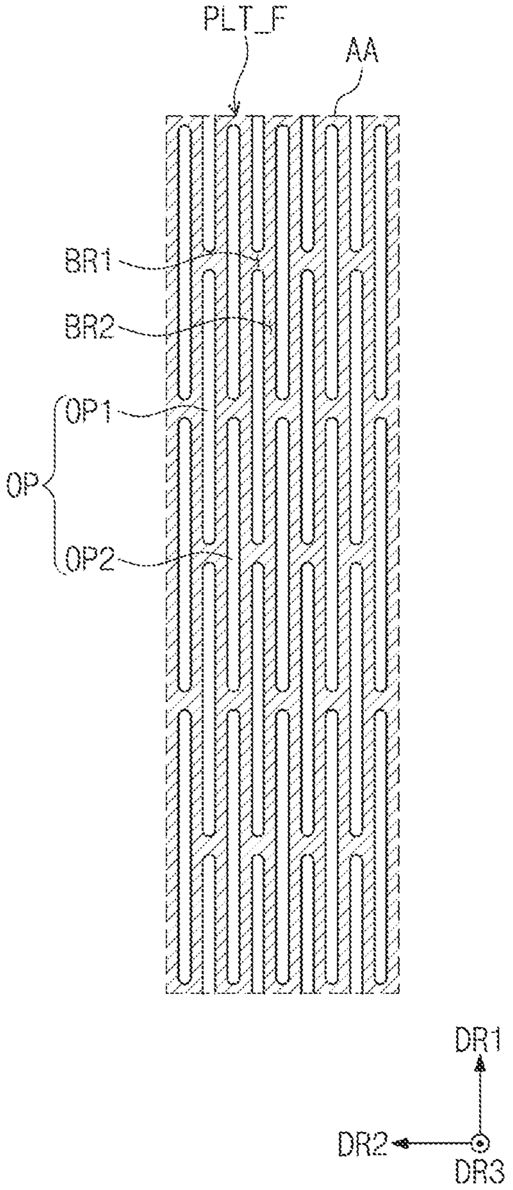
FIG. 17 is an enlarged view of a plane of a region AA illustrated in FIG. 16.

FIG. 16 is a perspective view of the first support plate illustrated in FIG. 9. FIG. 17 is an enlarged view of a plane of a region AA illustrated in FIG. 16.

Referring to FIG. 16, the first support plate PLT1 may include a first-first plate PLT1_1, a first-second plate PLT1_2, and a folding plate PLT_F. The folding plate PLT_F may be disposed between the first-first plate PLT1_1 and the first-second plate PLT1_2. The first-first plate PLT1_1 and the first-second plate PLT1_2 may respectively overlap the first non-folding region NFA1 and the second non-folding region NFA2 illustrated in FIG. 9. The folding plate PLT_F may overlap the folding region FA illustrated in FIG. 9.

A lattice pattern may be defined in the folding plate PLT_F. In an embodiment, a plurality of openings OP may be defined in the folding plate PLT_F, for example. The openings OP may be arranged according to a predetermined rule. The openings OP may be arranged in a lattice shape to form a lattice pattern on the folding plate PLT_F.

Since the openings OP are defined in the folding plate PLT_F, the area of the folding plate PLT_F may be reduced, thereby lowering the rigidity of the folding plate PLT_F. Therefore, when the openings OP are defined in the folding plate PLT_F, the flexibility of the folding plate PLT_F may be higher than when the openings OP are not defined therein. As a result, the folding plate PLT_F may be more easily folded.

The openings OP include a plurality of first openings OP1 arranged in the first direction DR1 and a plurality of second openings OP2 adjacent to the first openings OP1 in the second direction DR2 and arranged in the first direction DR1. The first openings OP1 may be disposed alternately with the second openings OP2.

The folding plate PLT_F may include first branch portions BR1 and second branch portions BR2. The first branch portions BR1 may be disposed between the first openings OP1 adjacent to each other in the first direction DR1 or between the second openings OP2 adjacent to each other in the first direction DR1. The second branch portions BR2 may be disposed between the first openings OP1 and the second openings OP2 adjacent to each other in the second direction DR2.

Figure 18A:
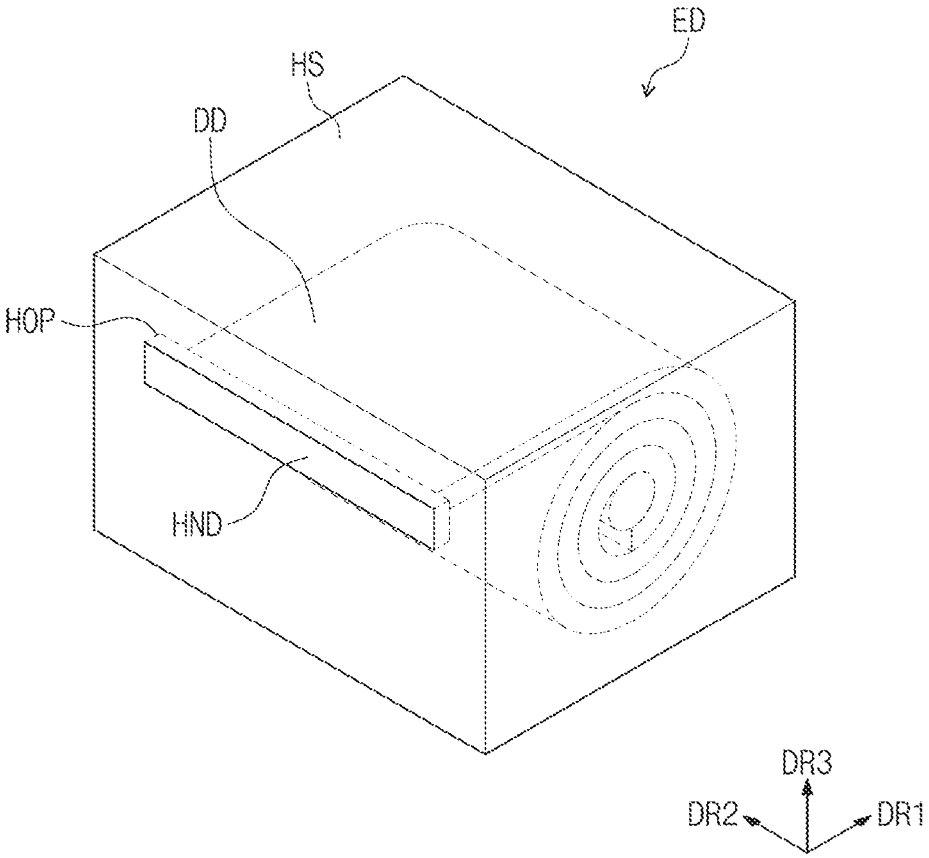
FIGS. 18A and 18B are drawings for describing another embodiment of the electronic device according to the inventive concept.
Figure 18B:
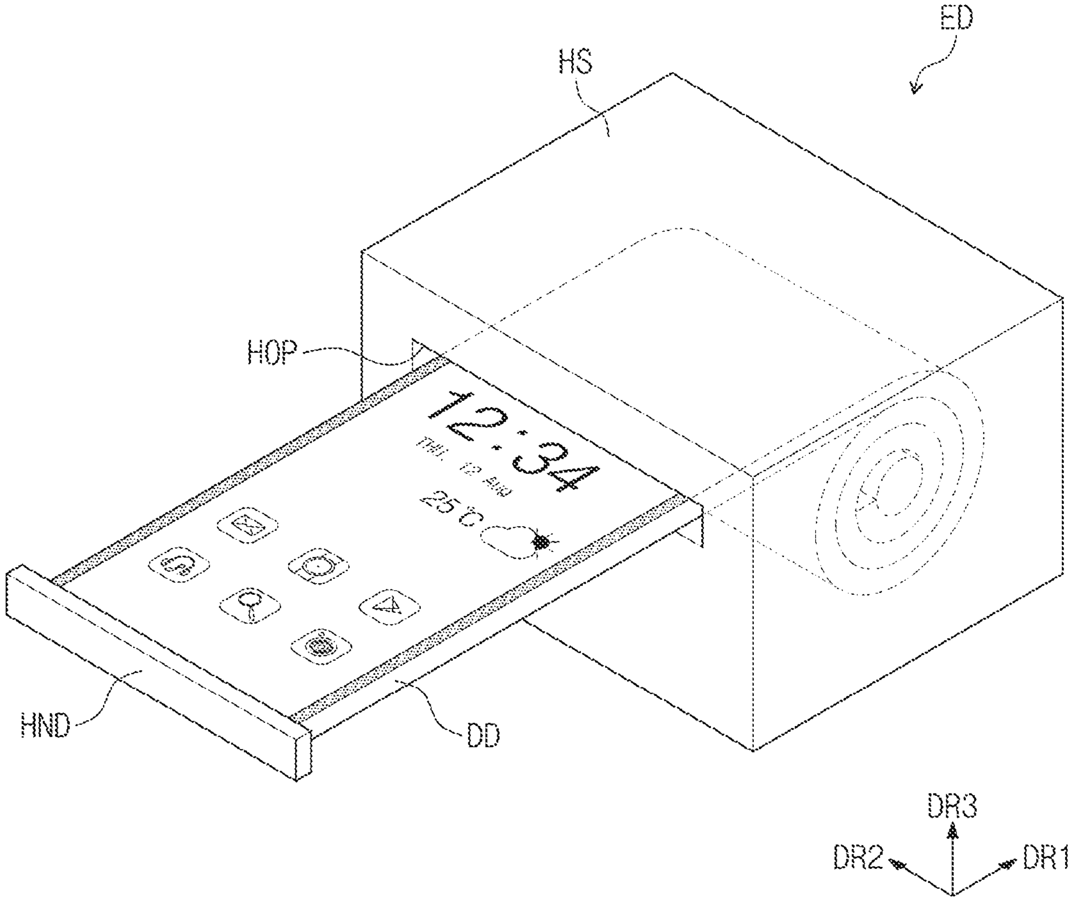

FIGS. 18A and 18B are drawings for describing another embodiment of the electronic device according to the inventive concept.

In an embodiment, FIG. 18A is a perspective view of the electronic device ED in another embodiment of the inventive concept. FIG. 18B illustrates the display module DM drawn out of the housing HS illustrated in FIG. 18A.

Referring to FIGS. 18A and 18B, the electronic device ED in an embodiment of the inventive concept may include a housing HS, a display device DD accommodated in the housing HS, and a handle HND connected to the display device DD.

The housing HS may have a hexahedral shape, but the shape of the housing HS is not limited thereto. The housing HS may extend longer in the second direction DR2 than in the first direction DR1.

A housing opening HOP may be defined on one of two opposing sides of the housing HS in the first direction DR1. The housing opening HOP may be closer to the upper portion of the housing HS than to the lower portion of the housing HS.

The display device DD may be wound around a roller (not illustrated) disposed in the housing HS and may be drawn in and out through the housing opening HOP. Without being limited thereto, however, the display device DD may slide from the inside of the housing HS to the outside so as to be drawn out without using a roller.

The handle HND may be disposed outside the housing HS and adjacent to the housing opening HOP. The handle HND may be adjacent to an upper portion of the housing HS. The handle HND may move in the first direction DR1. When the handle HND moves in the first direction DR1 to be away from the housing HS, the display device DD may be drawn out of the housing HS through the housing opening HOP. The handle HND may be operated by a user.

As illustrated in FIG. 18A, a state, in which the display device DD is disposed inside the housing HS and is not exposed to the outside, may be defined as a closed mode. As illustrated in FIG. 18B, an operation, in which the display device DD becomes exposed to the outside of the housing HS, may be defined as an open mode. In the open mode, the exposed portion of the display device DD may be expanded.

The display device DD illustrated in FIGS. 18A and 18B may be the display device DD illustrated in FIGS. 9 to 15. Accordingly, although an impact is applied to the display device DD, the possibility of damage to the display device DD may be reduced.

In an embodiment of the inventive concept, impact resistant layers may be disposed between the first support plate and the second support plate. The impact resistant layers may be any one of an adhesive layer, a cushion layer, and a cover layer, and the thickness of the impact resistant layers may be about 40 micrometers to about 300 micrometers. As the impact resistant layers have such a thickness, the deformation of the display module may be reduced although an external impact is applied to the display device.

Although described with reference to the above embodiments, those skilled in the art will understand that the inventive concept may be variously modified and changed without departing from the spirit and scope of the inventive concept described in the claims below. In addition, the embodiments disclosed in the inventive concept are not intended to limit the technical idea of the inventive concept, and all technical ideas within the scope of the following claims and their equivalents should be construed as being included in the scope of the inventive concept.

What is claimed is:

1. An electronic device comprising:
a display device comprising:
  a display panel comprising a first non-folding region, a folding region, and a second non-folding region;
  a first support plate disposed below the display panel and having a plurality of openings which overlap the folding region and are defined in the first support plate;
  a second support plate including:
    a second-first support plate overlapping the first non-folding region and disposed below the first support plate in a plan view; and
    a second-second support plate overlapping the second non-folding region and disposed below the first support plate in the plan view; and a plurality of impact resistant layers disposed between the first support plate and the second-first support plate and between the first support plate and the second-second support plate, the plurality of impact resistant layers comprising:

a first-first adhesive layer disposed between the first support plate and the second-first support plate;

a first-second adhesive layer disposed between the first support plate and the second-second support plate;

a cover layer overlapping the folding region, disposed below the first support plate and covering the plurality of openings in the plan view; and an adhesive layer overlapping the folding region and disposed between the cover layer and the first support plate in the plan view, wherein an empty space is provided between a side of the first-first adhesive layer adjacent to the first-second adhesive layer and a side of the first-second adhesive layer adjacent to the first-first adhesive layer in a manner in which the side of the first-first adhesive layer and the side of the first-second adhesive layer directly face each other through the empty space, and wherein each of the plurality of impact resistant layers has a thickness of about 40 micrometers to about 300 micrometers.

2. The electronic device of claim 1, wherein the first-first and first-second adhesive layers are disposed directly on a lower surface of the first support plate and an upper surface of the second support plate.

3. The electronic device of claim 1, wherein the cover layer and the adhesive layer are disposed between the first-first adhesive layer and the first-second adhesive layer.

4. The electronic device of claim 1, wherein a sum of a thicknesses of the cover layer and a thickness of the adhesive layer is smaller than a thickness of each of the first-first and first-second adhesive layers.

5. The electronic device of claim 1, wherein the second-first support plate and the second-second support plate extend below the folding region and are adjacent to each other.

6. The electronic device of claim 1, wherein an elastic moduli of the first support plate, the second-first support plate, and the second-second support plate are about 20 gigapascals to about 190 gigapascals.

7. The electronic device of claim 1, wherein an elastic moduli of the plurality of impact resistant layers are about 20 megapascals to about 1 gigapascal.

* * * * *